US011445323B2

(12) United States Patent
Neukam et al.

(10) Patent No.: US 11,445,323 B2
(45) Date of Patent: *Sep. 13, 2022

(54) METHOD FOR PROCESSING AN AUDIO SIGNAL, SIGNAL PROCESSING UNIT, BINAURAL RENDERER, AUDIO ENCODER AND AUDIO DECODER

(71) Applicant: Fraunhofer-Gesellschaft zur Foerderung der angewandten Forschung e.V., Munich (DE)

(72) Inventors: Simone Neukam, Kalchreuth (DE); Jan Plogsties, Fuerth (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 11 days.

This patent is subject to a terminal disclaimer.

(21) Appl. No.: 17/094,795

(22) Filed: Nov. 10, 2020

(65) Prior Publication Data

US 2021/0067898 A1 Mar. 4, 2021

Related U.S. Application Data

(63) Continuation of application No. 15/922,138, filed on Mar. 15, 2018, now Pat. No. 10,848,900, which is a (Continued)

(30) Foreign Application Priority Data

Jul. 22, 2013 (EP) .................................... 13177361
Oct. 18, 2013 (EP) .................................... 13189255

(51) Int. Cl.
*H04S 7/00* (2006.01)
*G10L 19/008* (2013.01)

(Continued)

(52) U.S. Cl.
CPC .............. *H04S 7/305* (2013.01); *G10K 15/08* (2013.01); *G10K 15/12* (2013.01); *G10L 19/008* (2013.01);

(Continued)

(58) Field of Classification Search
CPC ... H04S 7/305; H04S 7/30; H04S 7/00; H04S 2400/01; H04S 2400/03; H04S 2400/13;

(Continued)

(56) References Cited

U.S. PATENT DOCUMENTS 5,371,799 A 12/1994 Lowe et al.
6,122,382 A 9/2000 Iida et al.

(Continued)

FOREIGN PATENT DOCUMENTS

EP 1768107 A1 * 3/2007 ........... G10L 19/008
EP 1768107 A1 3/2007

(Continued)

OTHER PUBLICATIONS

Canfield-Dafilou, Elliot K, et al., "Allpass decorrelating filter design and evaluation", The Journal of the Acoustical Society of America 143, 1933 (2018); https://doi.org/1 O. I I 21/ 1.5036319, 2018.

(Continued)

*Primary Examiner* — Leshui Zhang
(74) *Attorney, Agent, or Firm* — Perkins Coie LLP; Michael A. Glenn

(57) ABSTRACT

A method for processing an audio signal in accordance with a room impulse response is described. The audio signal is processed with an early part of the room impulse response separate from a late reverberation of the room impulse response, wherein the processing of the late reverberation has generating a scaled reverberated signal, the scaling being (Continued)

dependent on the audio signal. The processed early part of the audio signal and the scaled reverberated signal are combined.

19 Claims, 8 Drawing Sheets

Related U.S. Application Data continuation of application No. 15/002,177, filed on Jan. 20, 2016, now Pat. No. 9,955,282, which is a continuation of application No. PCT/EP2014/065534, filed on Jul. 18, 2014.

(51) Int. Cl.

| | |
|---|---|
| ***G10K 15/12*** | (2006.01) |
| ***G10K 15/08*** | (2006.01) |
| ***G10L 25/06*** | (2013.01) |
| ***H03M 7/30*** | (2006.01) |

(52) U.S. Cl.

CPC ................ *G10L 25/06* (2013.01); *H04S 7/30* (2013.01); *H04S 2400/01* (2013.01); *H04S 2400/03* (2013.01); *H04S 2400/13* (2013.01); *H04S 2420/01* (2013.01)

(58) Field of Classification Search

CPC .......... H04S 2420/01; H04S 1/00; H04S 3/00; G10K 15/08; G10K 15/12; G10L 19/00; G10L 19/008; G10L 25/06; H03M 7/30; G10H 1/16; G10H 1/0091; H03G 3/00; H04B 3/00; H04H 20/61; H04R 2227/003; H04R 2227/005; H04R 27/00; H04R 3/12

USPC ....... 381/1, 2, 11, 17, 18, 19–23, 56, 57, 61, 381/63, 66, 317, 318, 321, 71.1–71.14, 381/74, 77, 80, 81, 82, 83, 84, 85, 86, 381/104, 106, 107, 108, 119, 120, 121; 700/94; 704/500–504

See application file for complete search history.

(56) References Cited

U.S. PATENT DOCUMENTS

| | | | | |
|---|---|---|---|---|
| 6,148,288 | A | 11/2000 | Park | |
| 6,188,769 | B1 | 2/2001 | Jot et al. | |
| 7,412,380 | B1 | 8/2008 | Avendano et al. | |
| 2002/0067836 | A1 | 6/2002 | Paranjpe | |
| 2002/0198615 | A1 * | 12/2002 | Suzuki | H04B 1/66 700/94 |
| 2003/0202667 | A1 | 10/2003 | Sekine | |
| 2005/0100171 | A1 | 5/2005 | Reilly et al. | |
| 2005/0180579 | A1 | 8/2005 | Baumgarte et al. | |
| 2007/0206690 | A1 | 9/2007 | Sperschneider et al. | |
| 2008/0071549 | A1 | 3/2008 | Chong et al. | |
| 2008/0126104 | A1 | 5/2008 | Seefeldt et al. | |
| 2008/0137875 | A1 * | 6/2008 | Zong | G10K 15/12 381/63 |
| 2008/0269926 | A1 * | 10/2008 | Xiang | H04M 1/6016 700/94 |
| 2009/0240503 | A1 | 9/2009 | Miyasaka et al. | |
| 2009/0260582 | A1 | 10/2009 | Kim | |
| 2010/0092002 | A1 | 4/2010 | Yoshino et al. | |
| 2010/0153097 | A1 | 6/2010 | Hotho et al. | |
| 2013/0034235 | A1 | 2/2013 | Lee et al. | |
| 2014/0355796 | A1 | 12/2014 | Xiang et al. | |

FOREIGN PATENT DOCUMENTS

| | | | |
|---|---|---|---|
| EP | 2535892 | B1 | 8/2014 |
| GB | 2485979 | A | 6/2012 |
| JP | H06335094 | A | 12/1994 |
| JP | H10174197 | A | 6/1998 |
| JP | 2004093728 | A | 3/2004 |
| JP | 2012150278 | A | 8/2012 |
| RU | 2194361 | C2 | 12/2002 |
| RU | 2355046 | C2 | 5/2009 |
| RU | 2411594 | C2 | 2/2011 |
| WO | 2008111143 | A1 | 9/2008 |
| WO | 2010012478 | A2 | 2/2010 |
| WO | 2010149700 | A1 | 12/2010 |
| WO | 2012/116934 | A1 | 9/2012 |
| WO | 2012116934 | A1 | 9/2012 |

OTHER PUBLICATIONS

Kendall, Gary S, "The Decorrelation of Audio Signals and Its Impact on Spatial Imagery", , 1995, pp. 71-87.

Kermit-Canfield, Elliot, et al., "Signal Decorrelation Using Perceptually Informed Allpass Filters", Sep. 2016.

Moorer, James A, "About This Reverberation Business", Computer Music Journal, vol. 3, No. 2, MIT Press, Jun. 1979, pp. 13-28.

Uhle, Christian, et al., "Predicting the Perceived Level of Late Reverberation Using Computational Models of Loudness", Proceedings, 17th International Conference on Digital Signal Processing (DSP), Jul. 6-8, 2011, Corfu, Greece, 8 pages.

* cited by examiner

METHOD FOR PROCESSING AN AUDIO SIGNAL, SIGNAL PROCESSING UNIT, BINAURAL RENDERER, AUDIO ENCODER AND AUDIO DECODER

CROSS-REFERENCE TO RELATED APPLICATIONS

This application is a continuation of U.S. application Ser. No. 15/922,138, filed Mar. 15, 2018, which in turn is a continuation of U.S. application Ser. No. 15/002,177, filed Jan. 20, 2016, which in turn is a continuation of International Application No. PCT/EP2014/065534, filed Jul. 18, 2014, which are incorporated herein by reference in their entirety, and additionally claims priority from European Application No. 13177361.6, filed Jul. 22, 2013, and from European Application No. 13189255.6, filed Oct. 18, 2013, which are also incorporated herein by reference in their entirety.

BACKGROUND OF THE INVENTION

The present invention relates to the field of audio encoding/decoding, especially to spatial audio coding and spatial audio object coding, e.g. the field of 3D audio codec systems. Embodiments of the invention relate to a method for processing an audio signal in accordance with a room impulse response, to a signal processing unit, a binaural renderer, an audio encoder and an audio decoder.

Spatial audio coding tools are well-known in the art and are standardized, for example, in the MPEG-surround standard. Spatial audio coding starts from a plurality of original input, e.g., five or seven input channels, which are identified by their placement in a reproduction setup, e.g., as a left channel, a center channel, a right channel, a left surround channel, a right surround channel and a low frequency enhancement channel. A spatial audio encoder may derive one or more downmix channels from the original channels and, additionally, may derive parametric data relating to spatial cues such as interchannel level differences in the channel coherence values, interchannel phase differences, interchannel time differences, etc. The one or more downmix channels are transmitted together with the parametric side information indicating the spatial cues to a spatial audio decoder for decoding the downmix channels and the associated parametric data in order to finally obtain output channels which are an approximated version of the original input channels. The placement of the channels in the output setup may be fixed, e.g., a 5.1 format, a 7.1 format, etc.

Also, spatial audio object coding tools are well-known in the art and are standardized, for example, in the MPEG SAOC standard (SAOC=spatial audio object coding). In contrast to spatial audio coding starting from original channels, spatial audio object coding starts from audio objects which are not automatically dedicated for a certain rendering reproduction setup. Rather, the placement of the audio objects in the reproduction scene is flexible and may be set by a user, e.g., by inputting certain rendering information into a spatial audio object coding decoder. Alternatively or additionally, rendering information may be transmitted as additional side information or metadata; rendering information may include information at which position in the reproduction setup a certain audio object is to be placed (e.g. over time). In order to obtain a certain data compression, a number of audio objects is encoded using an SAOC encoder which calculates, from the input objects, one or more transport channels by downmixing the objects in accordance with certain downmixing information. Furthermore, the SAOC encoder calculates parametric side information representing inter-object cues such as object level differences (OLD), object coherence values, etc. As in SAC (SAC=Spatial Audio Coding), the inter object parametric data is calculated for individual time/frequency tiles. For a certain frame (for example, 1024 or 2048 samples) of the audio signal a plurality of frequency bands (for example 24, 32, or 64 bands) are considered so that parametric data is provided for each frame and each frequency band. For example, when an audio piece has 20 frames and when each frame is subdivided into 32 frequency bands, the number of time/frequency tiles is 640.

In 3D audio systems it may be desired to provide a spatial impression of an audio signal as if the audio signal is listened to in a specific room. In such a situation, a room impulse response of the specific room is provided, for example on the basis of a measurement thereof, and is used for processing the audio signal upon presenting it to a listener. It may be desired to process the direct sound and early reflections in such a presentation separated from the late reverberation.

It is the object underlying the present invention to provide an approved approach for separately processing the audio signal with an early part and a late reverberation of the room impulse response allowing to achieve a result being perceptually as far as possible identical to the result of a convolution of the audio signal with the complete impulse response.

SUMMARY

According to an embodiment, a method for processing an audio signal in accordance with a room impulse response may have the steps of: separately processing the audio signal with an early part and a late reverberation of the room impulse response, wherein processing the late reverberation includes generating a scaled reverberated signal, the scaling being dependent on the audio signal; and combining the audio signal processed with the early part of the room impulse response and the scaled reverberated signal.

Another embodiment may have a non-transitory digital storage medium having a computer program stored thereon to perform the method for processing an audio signal in accordance with a room impulse response, the method having the steps of: separately processing the audio signal with an early part and a late reverberation of the room impulse response, wherein processing the late reverberation includes generating a scaled reverberated signal, the scaling being dependent on the audio signal; and combining the audio signal processed with the early part of the room impulse response and the scaled reverberated signal, when said computer program is run by a computer.

According to another embodiment, a signal processing unit may have: an input for receiving an audio signal, an early part processor for processing the received audio signal in accordance with an early part of a room impulse response, a late reverberation processor for processing the received audio signal in accordance with a late reverberation of the room impulse response, the late reverberation processor configured to generate a scaled reverberated signal, the scaling being dependent on the received audio signal; and an output for combining the processed early part of the received audio signal and the scaled reverberated signal into an output audio signal.

Another embodiment may have a binaural renderer having the inventive signal processing unit.

Another embodiment may have an audio encoder for coding audio signals, having: the inventive signal processing unit or a binaural renderer having the signal processing unit for processing the audio signals prior to coding.

Another embodiment may have an audio decoder for decoding encoded audio signals, having: an inventive signal processing unit or a binaural renderer having the signal processing unit for processing the decoded audio signals.

The present invention is based on the inventor's findings that in conventional approaches a problem exists in that upon processing of the audio signal in accordance the room impulse response the result of processing the audio signal separately with regard to the early part and the reverberation deviates from a result when applying a convolution with a complete impulse response. The invention is further based on the inventor's findings that an adequate level of reverberation depends on both the input audio signal and the impulse response, because the influence of the input audio signal on the reverberation is not fully preserved when, for example, using a synthetic reverberation approach. The influence of the impulse response may be considered by using known reverberation characteristics as input parameter. The influence of the input signal may be considered by a signal-dependent scaling for adapting the level of reverberation that is determined on the basis of the input audio signal. It has been found that by this approach the perceived level of the reverberation matches better the level of reverberation when using the full-convolution approach for the binaural rendering.

(1) The present invention provides a method for processing an audio signal in accordance with a room impulse response, the method comprising:

separately processing the audio signal with an early part and a late reverberation of the room impulse response, wherein processing the late reverberation comprises generating a scaled reverberated signal, the scaling being dependent on the audio signal; and combining the audio signal processed with the early part of the room impulse response and the scaled reverberated signal.

When compared to conventional approaches described above, the inventive approach is advantageous as it allows scaling the late reverberation without the need to calculate the full-convolutional result or without the need of applying an extensive and non-exact hearing model. Embodiments of the inventive approach provide an easy method to scale artificial late reverberation such that it sounds like the reverberation in a full-convolutional approach. The scaling is based on the input signal and no additional model of hearing or target reverberation loudness is needed. The scaling factor may be derived in a time frequency domain which is an advantage because also the audio material in the encoder/decoder chain is often available in this domain.

(2) In accordance with embodiments the scaling may be dependent on the condition of the one or more input channels of the audio signal (e.g. the number of input channels, the number of active input channels and/or the activity in the input channel).

This is advantageous because the scaling can be easily determined from the input audio signal with a reduced computational overhead. For example, the scaling can be determined by simply determining the number of channels in the original audio signal that are downmixed to a currently considered downmix channel including a reduced number of channels when compared to the original audio signal. Alternatively, the number of active channels (channels showing some activity in a current audio frame) downmixed to the currently considered downmix channel may form the basis for scaling the reverberated signal.

(3) In accordance with embodiments the scaling (in addition to or alternatively to the input channel condition) is dependent on a predefined or calculated correlation measure of the audio signal.

Using a predefined correlation measure is advantageous as it reduces the computational complexity in the process. The predefined correlation measure may have a fixed value, e.g. in the range of 0.1 to 0.9, that may be determined empirically on the basis of an analysis of a plurality of audio signals. On the other hand, calculating the correlation measure is advantageous, despite the additional computational resources needed, in case it is desired to obtain a more precise measure for the currently processed audio signal individually.

(4) In accordance with embodiments generating the scaled reverberated signal comprises applying a gain factor, wherein the gain factor is determined based on the condition of the one or more input channels of the audio signal and/or based on the predefined or calculated correlation measure for the audio signal, wherein the gain factor may be applied before, during or after processing the late reverberation of the audio signal.

This is advantageous because the gain factor can be easily calculated on the basis of the above parameters and can be applied flexibly with respect to the reverberator in the processing chain dependent of the implementation specifics.

(5) In accordance with embodiments the gain factor is determined as follows:

$$g=c_u+\rho\cdot(c_c-c_u)$$

where

ρ=predefined or calculated correlation measure for the audio signal, $c_u$, $c_c$=factors indicative of the condition of the one or more input channels of the audio signal, with $c_u$ referring to totally uncorrelated channels, and $c_c$ relating to totally correlated channels.

This is advantageous because the factor scales over time with the number of active channels in the audio signal.

(6) In accordance with embodiments $c_u$ and $c_c$ are determined as follows:

$$c_u = 10^{\frac{10\cdot log_{10}(K_{in})}{20}} = \sqrt{K_{in}}$$

$$c_c = 10^{\frac{20\cdot log_{10}(K_{in})}{20}} = K_{in}$$

where $K_{in}$=number of active or fixed downmix channels.

This is advantageous because the factor is directly dependent on the number of active channels in the audio signal. If no channels are active, then the reverberation is scaled with zero, if more channels are active the amplitude of the reverberation gets bigger.

(7) In accordance with embodiments the gain factors are low pass filtered over the plurality of audio frames, wherein the gain factors may be low pass filtered as follows:

$$g_s(t_i) = c_{s,old}\cdot g_s(t_i-1) + c_{s,new}\cdot g$$

$$c_{s,old} = e^{-\left(\frac{1}{f_s\cdot\frac{t_s}{k}}\right)}$$

$$c_{s,new} = 1 - c_{s,old}$$

where $t_s$=time constant of the low pass filter $t_i$=audio frame at frame $t_i$ $g_s$=smoothed gain factor k=frame size, and $f_s$=sampling frequency.

This is advantageous because no abrupt changes occur for the scaling factor over time.

(8) In accordance with embodiments generating the scaled reverberated signal comprises a correlation analysis of the audio signal, wherein the correlation analysis of the audio signal may comprise determining for an audio frame of the audio signal a combined correlation measure, wherein the combined correlation measure may be calculated by combining the correlation coefficients for a plurality of channel combinations of one audio frame, each audio frame comprising one or more time slots, and wherein combining the correlation coefficients may comprise averaging a plurality of correlation coefficients of the audio frame.

This is advantageous because the correlation can be described by one single value that describes the overall correlation of one audio frame. There is no need to handle multiple frequency-dependent values.

(9) In accordance with embodiments determining the combined correlation measure may comprise (i) calculating an overall mean value for every channel of the one audio frame, (ii) calculating a zero-mean audio frame by subtracting the mean values from the corresponding channels, (iii) calculating for a plurality of channel combination the correlation coefficient, and (iv) calculating the combined correlation measure as the mean of a plurality of correlation coefficients.

This is advantageous because, as mentioned above, just one single overall correlation value per frame is calculated (easy handling) and the calculation can be done similar to the "standard" Pearson's correlation coefficient, which also uses zero-mean signals and their standard deviations.

(10) In accordance with embodiments the correlation coefficient for a channel combination is determined as follows:

$$\rho[m,n]=\left|\frac{1}{(N-1)}\cdot\frac{\sum_i\sum_j x_m[i,j]\cdot x_n[i,j]^*}{\sum_j \sigma(x_m[j])\cdot\sigma(x_n[j])}\right|$$

where

ρ[m,n]=correlation coefficient, $\sigma(x_m[j])$=standard deviation across one time slot j of channel m, $\sigma(x_n[j])$=standard deviation across one time slot j of channel n, $x_m, x_n$=zero-mean variables, i∀[1,N]=frequency bands, j∀[1,M]=time slots, m,n∀[1,K]=channels,

*=complex conjugate.

This is advantageous because the well-known formula for the Pearsons's correlation coefficient may be used and is transformed to a frequency- and time-dependent formula.

(11) In accordance with embodiments processing the late reverberation of the audio signal comprises downmixing the audio signal and applying the downmixed audio signal to a reverberator.

This is advantageous because the processing, e.g., in a reverberator, needs to handle less channels and the downmix process can directly be controlled.

(12) The present invention provides a signal processing unit, comprising an input for receiving an audio signal, an early part processor for processing the received audio signal in accordance with an early part of a room impulse response, a late reverberation processor for processing the received audio signal in accordance with a late reverberation of the room impulse response, the late reverberation processor configured to or programmed to generate a scaled reverberated signal dependent on the received audio signal, and an output for combining the audio signal processed with the early part of the room impulse response and the scaled reverberated signal into an output audio signal.

(13) In accordance with embodiments the late reverberation processor comprises a reverberator receiving the audio signal and generating a reverberated signal, a correlation analyzer generating a gain factor dependent on the audio signal, and a gain stage coupled to an input or an output of the reverberator and controlled by the gain factor provided by the correlation analyzer.

(14) In accordance with embodiments the signal processing unit further comprises at least one of a low pass filter coupled between the correlation analyzer and the gain stage, and a delay element coupled between the gain stage and an adder, the adder further coupled to the early part processor and the output.

(15) The present invention provides a binaural renderer, comprising the inventive signal processing unit.

(16) The present invention provides an audio encoder for coding audio signals, comprising the inventive signal processing unit or the inventive binaural renderer for processing the audio signals prior to coding.

(17) The present invention provides an audio decoder for decoding encoded audio signals, comprising the inventive signal processing unit or the inventive binaural renderer for processing the decoded audio signals.

BRIEF DESCRIPTION OF THE DRAWINGS

Embodiments of the present invention will be described with regard to the accompanying drawings, in which.

DETAILED DESCRIPTION OF THE INVENTION

Embodiments of the inventive approach will now be described. The following description will start with a system overview of a 3D audio codec system in which the inventive approach may be implemented.

Figure 1:
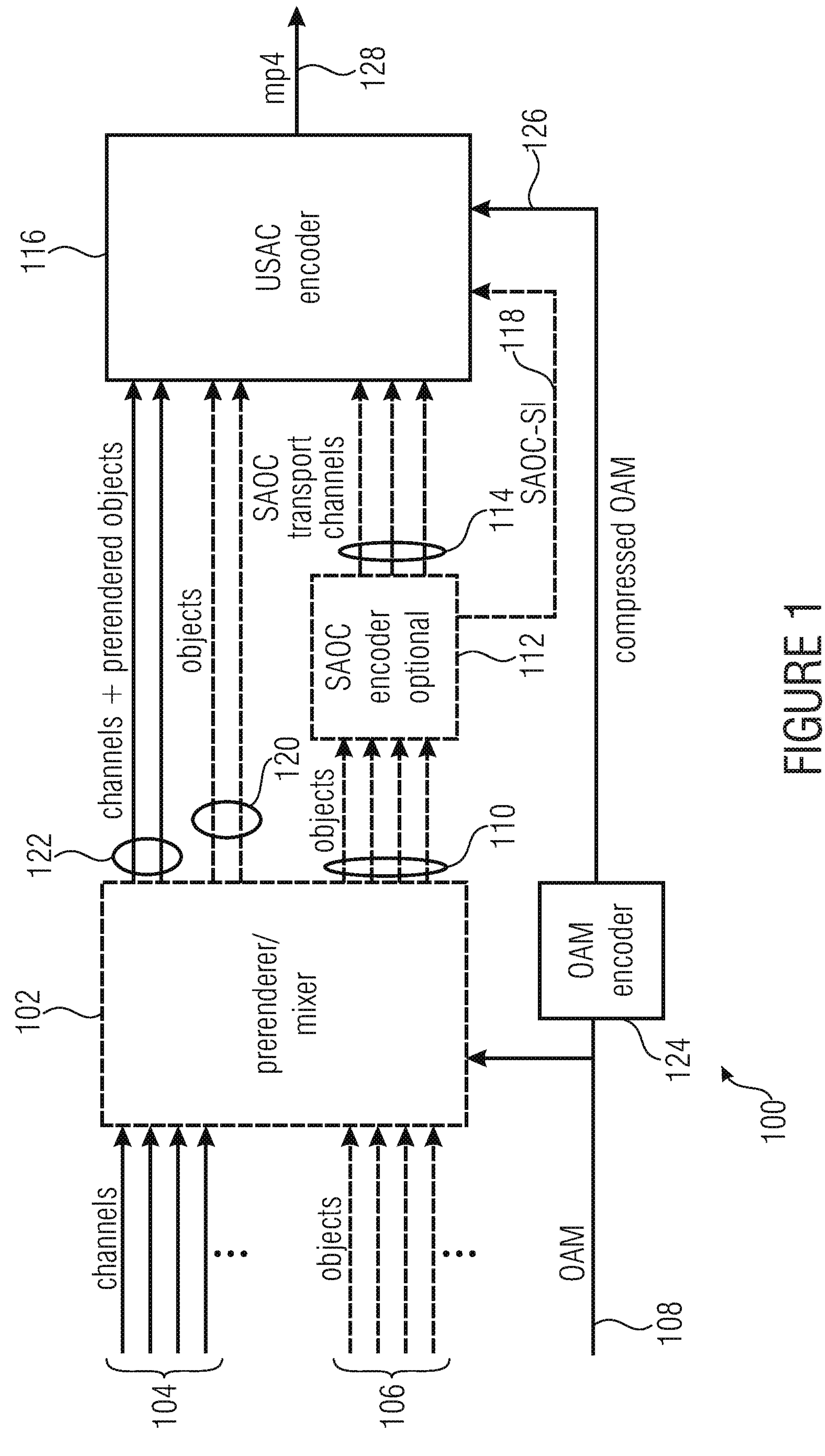
FIG. 1 illustrates an overview of a 3D audio encoder of a 3D audio system.
Figure 2:
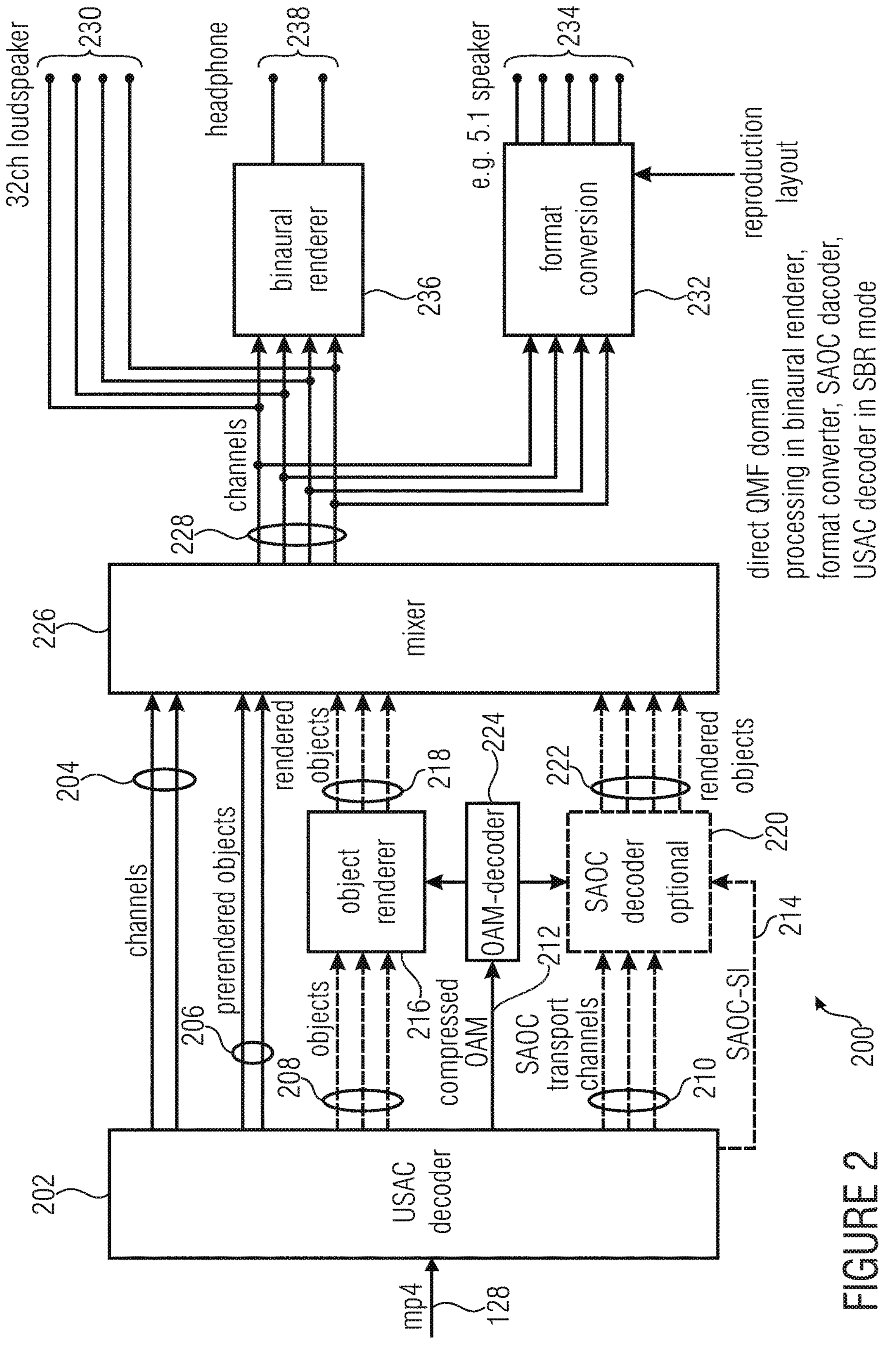
FIG. 2 illustrates an overview of a 3D audio decoder of a 3D audio system.

FIGS. 1 and 2 show the algorithmic blocks of a 3D audio system in accordance with embodiments. More specifically, FIG. 1 shows an overview of a 3D audio encoder 100. The audio encoder 100 receives at a pre-renderer/mixer circuit 102, which may be optionally provided, input signals, more specifically a plurality of input channels providing to the audio encoder 100 a plurality of channel signals 104, a plurality of object signals 106 and corresponding object metadata 108. The object signals 106 processed by the pre-renderer/mixer 102 (see signals 110) may be provided to a SAOC encoder 112 (SAOC=Spatial Audio Object Coding). The SAOC encoder 112 generates the SAOC transport channels 114 provided to an USAC encoder 116 (USAC=Unified Speech and Audio Coding). In addition, the signal SAOC-SI 118 (SAOC-SI=SAOC side information) is also provided to the USAC encoder 116. The USAC encoder 116 further receives object signals 120 directly from the pre-renderer/mixer as well as the channel signals and pre-rendered object signals 122. The object metadata information 108 is applied to a OAM encoder 124 (OAM=object metadata) providing the compressed object metadata information 126 to the USAC encoder. The USAC encoder 116, on the basis of the above mentioned input signals, generates a compressed output signal mp4, as is shown at 128. FIG. 2 shows an overview of a 3D audio decoder 200 of the 3D audio system. The encoded signal 128 (mp4) generated by the audio encoder 100 of FIG. 1 is received at the audio decoder 200, more specifically at an USAC decoder 202. The USAC decoder 202 decodes the received signal 128 into the channel signals 204, the pre-rendered object signals 206, the object signals 208, and the SAOC transport channel signals 210. Further, the compressed object metadata information 212 and the signal SAOC-SI 214 is output by the USAC decoder 202. The object signals 208 are provided to an object renderer 216 outputting the rendered object signals 218. The SAOC transport channel signals 210 are supplied to the SAOC decoder 220 outputting the rendered object signals 222. The compressed object meta information 212 is supplied to the OAM decoder 224 outputting respective control signals to the object renderer 216 and the SAOC decoder 220 for generating the rendered object signals 218 and the rendered object signals 222. The decoder further comprises a mixer 226 receiving, as shown in FIG. 2, the input signals 204, 206, 218 and 222 for outputting the channel signals 228. The channel signals can be directly output to a loudspeaker, e.g., a 32 channel loudspeaker, as is indicated at 230. The signals 228 may be provided to a format conversion circuit 232 receiving as a control input a reproduction layout signal indicating the way the channel signals 228 are to be converted. In the embodiment depicted in FIG. 2, it is assumed that the conversion is to be done in such a way that the signals can be provided to a 5.1 speaker system as is indicated at 234. Also, the channels signals 228 may be provided to a binaural renderer 236 generating two output signals, for example for a headphone, as is indicated at 238.

In an embodiment of the present invention, the encoding/decoding system depicted in FIGS. 1 and 2 is based on the MPEG-D USAC codec for coding of channel and object signals (see signals 104 and 106). To increase the efficiency for coding a large amount of objects, the MPEG SAOC technology may be used. Three types of renderers may perform the tasks of rendering objects to channels, rendering channels to headphones or rendering channels to a different loudspeaker setup (see FIG. 2, reference signs 230, 234 and 238). When object signals are explicitly transmitted or parametrically encoded using SAOC, the corresponding object metadata information 108 is compressed (see signal 126) and multiplexed into the 3D audio bitstream 128.

The algorithm blocks for the overall 3D audio system shown in FIGS. 1 and 2 will be described in further detail below.

The pre-renderer/mixer 102 may be optionally provided to convert a channel plus object input scene into a channel scene before encoding. Functionally, it is identical to the object renderer/mixer that will be described below. Pre-rendering of objects may be desired to ensure a deterministic signal entropy at the encoder input that is basically independent of the number of simultaneously active object signals. With pre-rendering of objects, no object metadata transmission is required. Discrete object signals are rendered to the channel layout that the encoder is configured to use. The weights of the objects for each channel are obtained from the associated object metadata (OAM).

The USAC encoder 116 is the core codec for loudspeaker-channel signals, discrete object signals, object downmix signals and pre-rendered signals. It is based on the MPEG-D USAC technology. It handles the coding of the above signals by creating channel- and object mapping information based on the geometric and semantic information of the input channel and object assignment. This mapping information describes how input channels and objects are mapped to USAC-channel elements, like channel pair elements (CPEs), single channel elements (SCEs), low frequency effects (LFEs) and quad channel elements (QCEs) and CPEs, SCEs and LFEs, and the corresponding information is transmitted to the decoder. All additional payloads like SAOC data 114, 118 or object metadata 126 are considered in the encoder's rate control. The coding of objects is possible in different ways, depending on the rate/distortion requirements and the interactivity requirements for the renderer. In accordance with embodiments, the following object coding variants are possible:

Pre-rendered objects: Object signals are pre-rendered and mixed to the 22.2 channel signals before encoding. The subsequent coding chain sees 22.2 channel signals.

Discrete object waveforms: Objects are supplied as monophonic waveforms to the encoder. The encoder uses single channel elements (SCEs) to transmit the objects in addition to the channel signals. The decoded objects are rendered and mixed at the receiver side. Compressed object metadata information is transmitted to the receiver/renderer.

Parametric object waveforms: Object properties and their relation to each other are described by means of SAOC parameters. The downmix of the object signals is coded with the USAC. The parametric information is transmitted alongside. The number of downmix channels is chosen depending on the number of objects and the overall data rate. Compressed object metadata information is transmitted to the SAOC renderer.

The SAOC encoder 112 and the SAOC decoder 220 for object signals may be based on the MPEG SAOC technology. The system is capable of recreating, modifying and rendering a number of audio objects based on a smaller number of transmitted channels and additional parametric data, such as OLDs, IOCs (Inter Object Coherence), DMGs (DownMix Gains). The additional parametric data exhibits a significantly lower data rate than necessitated for transmitting all objects individually, making the coding very efficient. The SAOC encoder 112 takes as input the object/channel signals as monophonic waveforms and outputs the parametric information (which is packed into the 3D-Audio bitstream 128) and the SAOC transport channels (which are encoded using single channel elements and are transmitted). The SAOC decoder 220 reconstructs the object/channel signals from the decoded SAOC transport channels 210 and the parametric information 214, and generates the output audio scene based on the reproduction layout, the decompressed object metadata information and optionally on the basis of the user interaction information.

The object metadata codec (see OAM encoder 124 and OAM decoder 224) is provided so that, for each object, the associated metadata that specifies the geometrical position and volume of the objects in the 3D space is efficiently coded by quantization of the object properties in time and space. The compressed object metadata cOAM 126 is transmitted to the receiver 200 as side information.

The object renderer 216 utilizes the compressed object metadata to generate object waveforms according to the given reproduction format. Each object is rendered to a certain output channel according to its metadata. The output of this block results from the sum of the partial results. If both channel based content as well as discrete/parametric objects are decoded, the channel based waveforms and the rendered object waveforms are mixed by the mixer 226 before outputting the resulting waveforms 228 or before feeding them to a postprocessor module like the binaural renderer 236 or the loudspeaker renderer module 232.

The binaural renderer module 236 produces a binaural downmix of the multichannel audio material such that each input channel is represented by a virtual sound source. The processing is conducted frame-wise in the QMF (Quadrature Mirror Filterbank) domain, and the binauralization is based on measured binaural room impulse responses.

The loudspeaker renderer 232 converts between the transmitted channel configuration 228 and the desired reproduction format. It may also be called "format converter". The format converter performs conversions to lower numbers of output channels, i.e., it creates downmixes.

Figure 3:
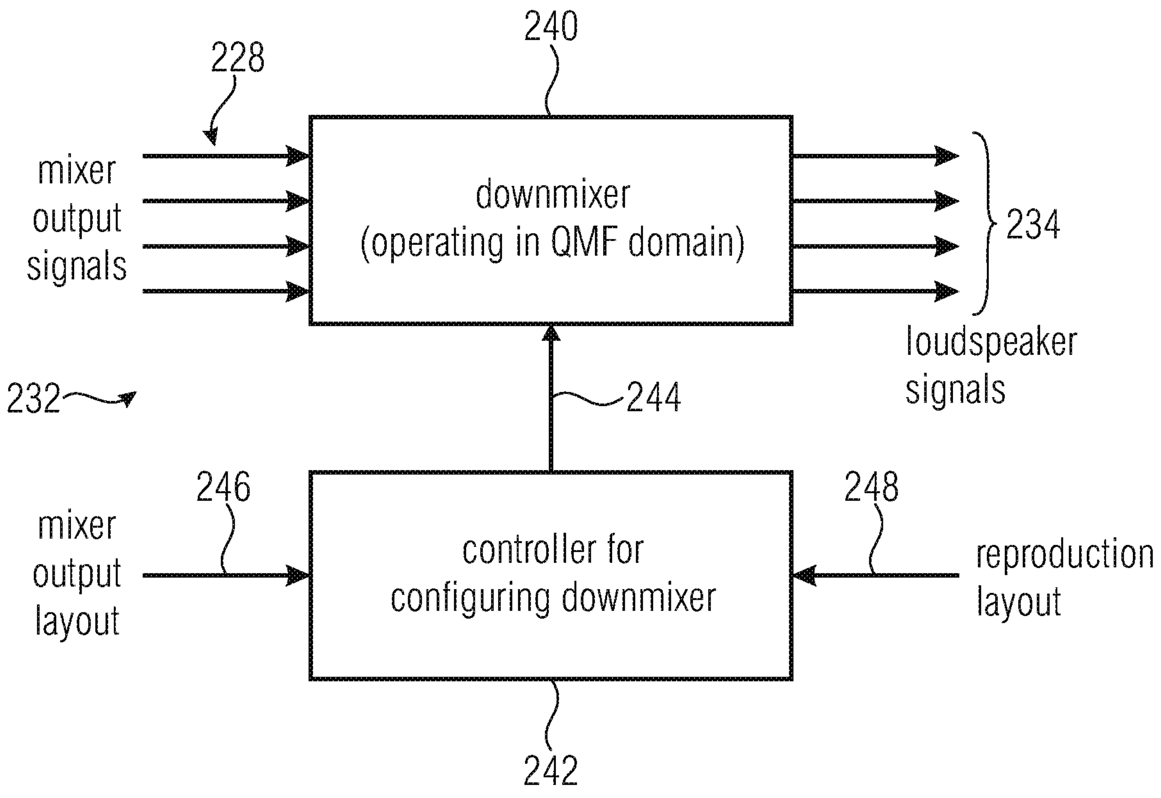
FIG. 3 illustrates an example for implementing a format converter that may be implemented in the 3D audio decoder of FIG. 2.

FIG. 3 shows an example for implementing a format converter 232. The format converter 232, also referred to as loudspeaker renderer, converts between the transmitter channel configuration and the desired reproduction format. The format converter 232 performs conversions to a lower number of output channels, i.e., it performs a downmix (DMX) process 240. The downmixer 240, which advantageously operates in the QMF domain, receives the mixer output signals 228 and outputs the loudspeaker signals 234. A configurator 242, also referred to as controller, may be provided which receives, as a control input, a signal 246 indicative of the mixer output layout, i.e., the layout for which data represented by the mixer output signal 228 is determined, and the signal 248 indicative of the desired reproduction layout. Based on this information, the controller 242, advantageously automatically, generates optimized downmix matrices for the given combination of input and output formats and applies these matrices to the downmixer 240. The format converter 232 allows for standard loudspeaker configurations as well as for random configurations with non-standard loudspeaker positions.

Figure 4:
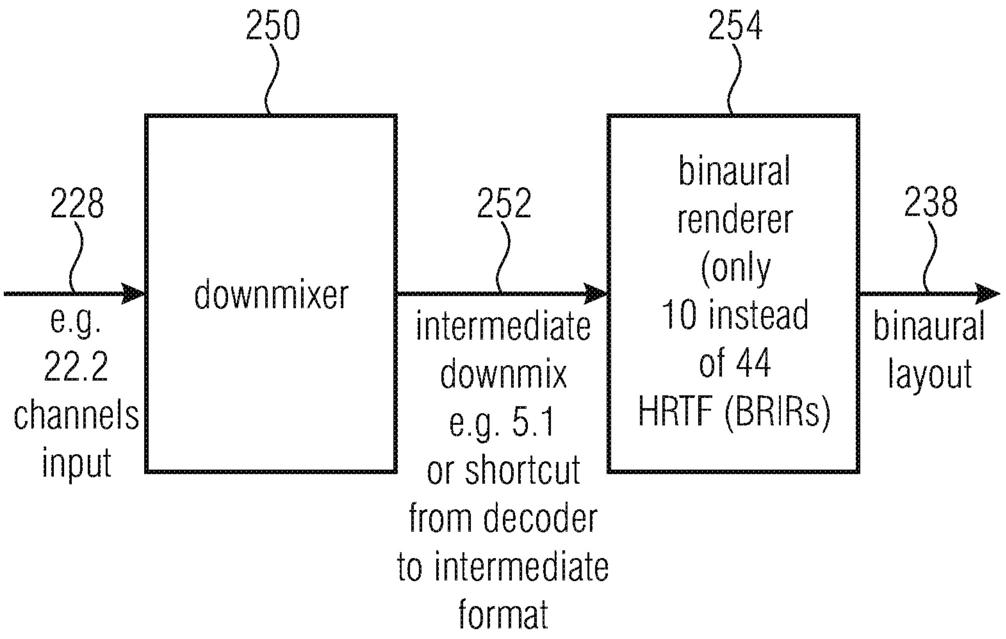
FIG. 4 illustrates an embodiment of a binaural renderer that may be implemented in the 3D audio decoder of FIG. 2.

FIG. 4 illustrates an embodiment of the binaural renderer 236 of FIG. 2. The binaural renderer module may provide a binaural downmix of the multichannel audio material. The binauralization may be based on measured binaural room impulse responses. The room impulse responses may be considered a "fingerprint" of the acoustic properties of a real room. The room impulse responses are measured and stored, and arbitrary acoustical signals can be provided with this "fingerprint", thereby allowing at the listener a simulation of the acoustic properties of the room associated with the room impulse response. The binaural renderer 236 may be configured or programmed to for rendering the output channels into two binaural channels using head related transfer functions or binaural room impulse responses (BRIR). For example, for mobile devices binaural rendering is desired for headphones or loudspeakers attached to such mobile devices. In such mobile devices, due to constraints it may be necessitated to limit the decoder and rendering complexity. In addition to omitting decorrelation in such processing scenarios, it may be of advantage to first perform a downmix using a downmixer 250 to an intermediate downmix signal 252, i.e., to a lower number of output channels which results in a lower number of input channel for the actual binaural converter 254. For example, a 22.2 channel material may be downmixed by the downmixer 250 to a 5.1 intermediate downmix or, alternatively, the intermediate downmix may be directly calculated by the SAOC decoder 220 in FIG. 2 in a kind of a "shortcut" mode. The binaural rendering then only has to apply ten HRTFs (Head Related Transfer Functions) or BRIR functions for rendering the five individual channels at different positions in contrast to applying 44 HRTF or BRIR functions if the 22.2 input channels were to be directly rendered. The convolution operations necessitated for the binaural rendering necessitate a lot of processing power and, therefore, reducing this processing power while still obtaining an acceptable audio quality is particularly useful for mobile devices. The binaural renderer 236 produces a binaural downmix 238 of the multichannel audio material 228, such that each input channel (excluding the LFE channels) is represented by a virtual sound source. The processing may be conducted frame-wise in QMF domain. The binauralization is based on measured binaural room impulse responses, and the direct sound and early reflections may be imprinted to the audio material via a convolutional approach in a pseudo-FFT domain using a fast convolution on-top of the QMF domain, while late reverberation may be processed separately.

Figure 5:
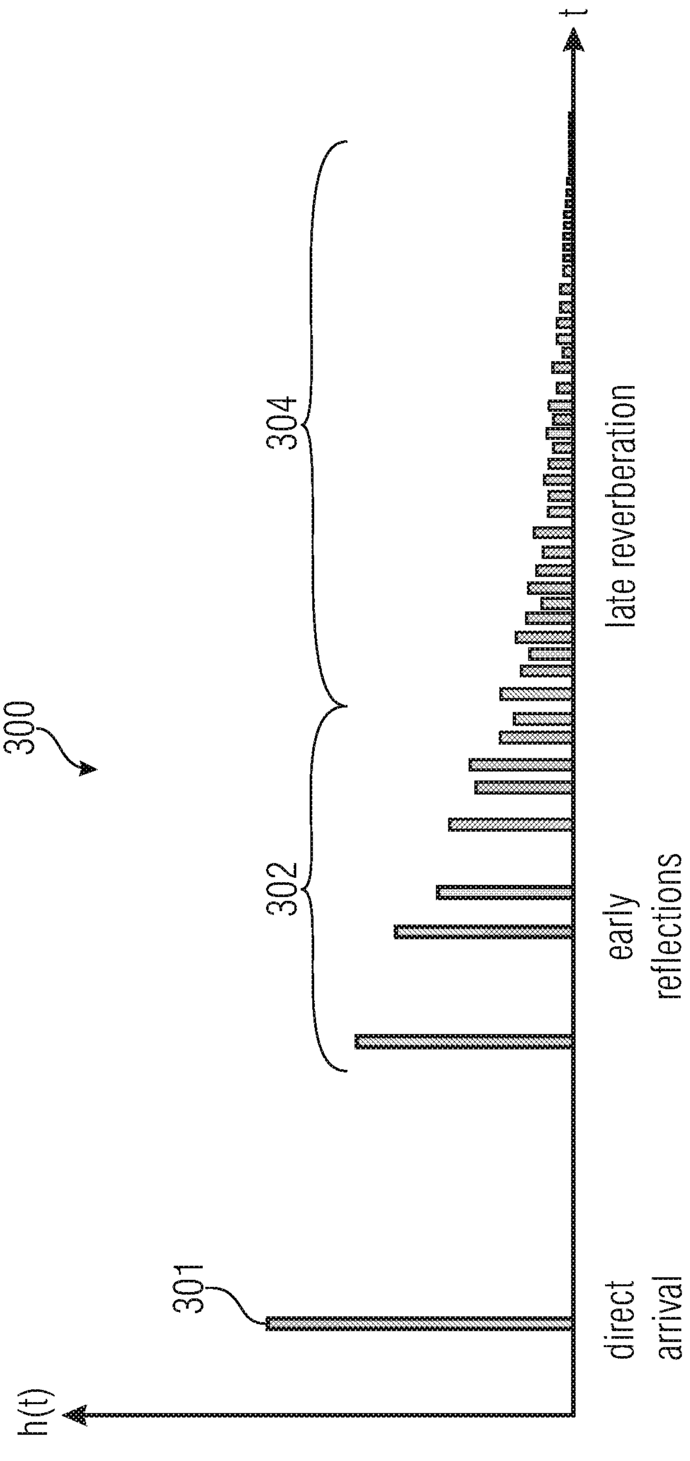
FIG. 5 illustrates an example of a room impulse response h(t)

FIG. 5 shows an example of a room impulse response h(t) 300. The room impulse response comprises three components, the direct sound 301, early reflections 302 and late reverberation 304. Thus, the room impulse response describes the reflections behavior of an enclosed reverberant acoustic space when an impulse is played. The early reflection 302 are discrete reflections with increasing density, and the part of the impulse response where the individual reflections can no longer be discriminated is called late reverberation 304. The direct sound 301 can be easily identified in the room impulse response and can be separated from early reflections, however, the transition from the early reflection 302 to late reverberation 304 is less obvious.

As has been described above, in a binaural renderer, for example a binaural renderer as it is depicted in FIG. 2, different approaches for processing a multichannel audio input signal in accordance with a room impulse response are known.

Figure 6A:
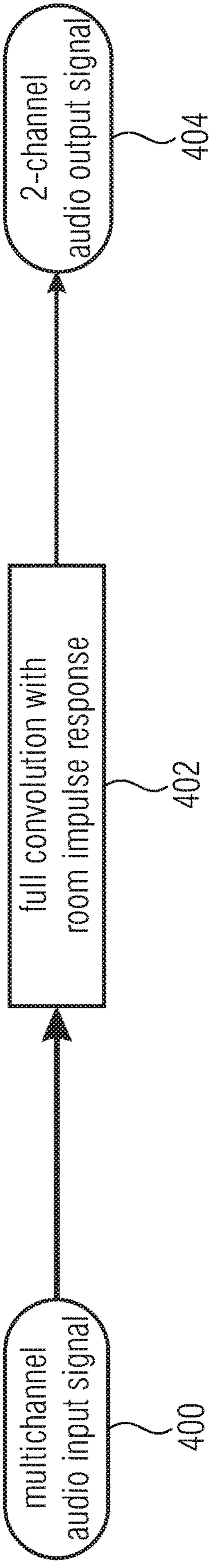
FIG. 6*a-b* illustrates different possibilities for processing an audio input signal with a room impulse response, wherein FIG. 6(*a*) shows processing the complete audio signal in accordance with the room impulse response, and FIG. 6(*b*) shows the separate processing of the early part and the late reverberation part.
Figure 6B:
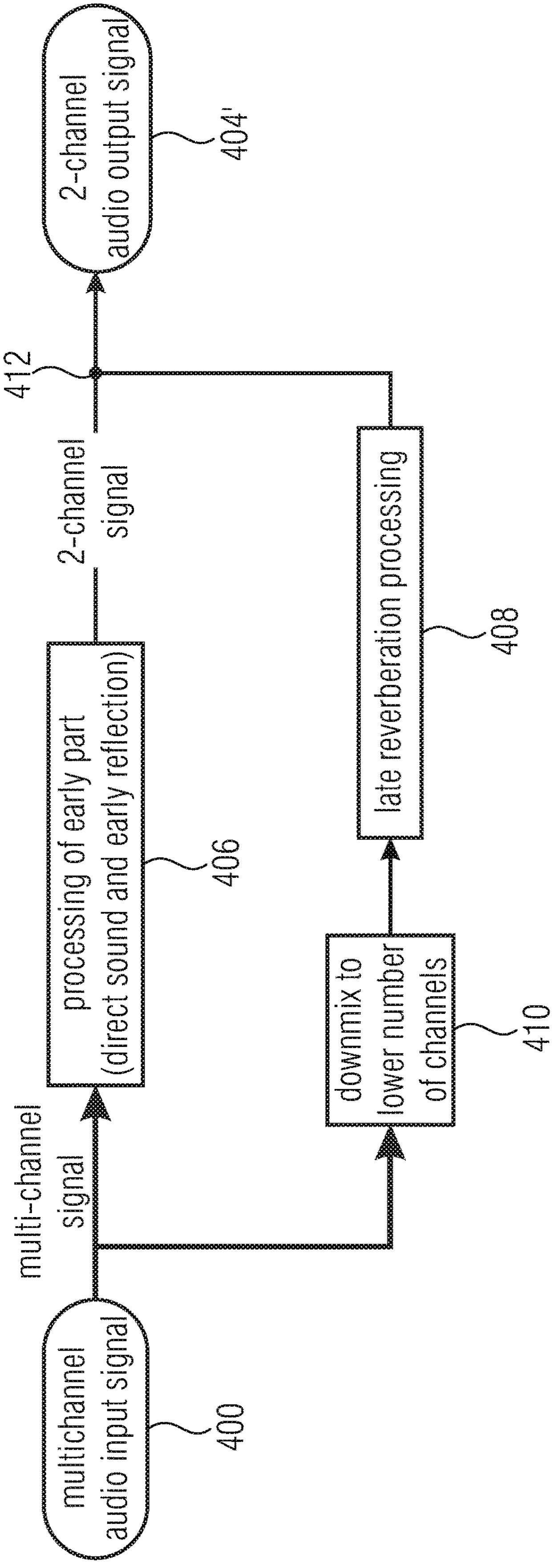

FIG. 6 shows different possibilities for processing an audio input signal with a room impulse response. FIG. 6(*a*) shows processing the complete audio signal in accordance with the room impulse response, and FIG. 6(*b*) shows the separate processing of the early part and the late reverberation part. As shown in FIG. 6(*a*) an input signal 400, for example a multichannel audio input signal, is received and applied to a processor 402 that is configured to or programmed to allow a full convolution of the multichannel audio input signal 400 with the room impulse response (see FIG. 5) which, in the depicted embodiment, yields the 2-channel audio output signal 404. As mentioned above, this approach is considered disadvantageous as using the convolution for the entire impulse response is computationally very costly. Therefore, in accordance with another approach, as depicted in FIG. 6(*b*), instead of processing the entire multichannel audio input signal by applying a full convolution with a room impulse response as has been described with regard to FIG. 6(*a*), the processing is separated with regard to the early parts 301, 302 (see FIG. 5) of the room impulse response 300, and the late reverberation part 302. More specifically, as is shown in FIG. 6(*b*), the multichannel audio input signal 400 is received, however the signal is applied in parallel to a first processor 406 for processing the early part, namely for processing the audio signal in accordance with the direct sound 301 and the early reflections 302 in the room impulse response 300 shown in FIG. 5. The multichannel audio input signal 400 is also applied to a processor 408 for processing the audio signal in accordance with the late reverberation 304 of the room impulse response 300. In the embodiment depicted in FIG. 6(*b*) the multichannel audio input signal may also be applied to a downmixer 410 for downmixing the multichannel signal 400 to a signal having a lower number of channels. The output of the downmixer 410 is then applied to the processor 408. The outputs of the processors 406 and 408 are combined at 412 to generate the 2-channel audio output signal 404'.

In a binaural renderer, as mentioned above, it may be desired to process the direct sound and early reflections separate from the late reverberation, mainly because of the reduced computational complexity. The processing of the direct sound and early reflections may, for example, be imprinted to the audio signal by a convolutional approach carried out by the processor 406 (see FIG. 6(*b*)) while the late reverberation may be replaced by a synthetic reverberation provided by the processor 408. The overall binaural output signal 404' is then a combination of the convolutional result provided by the processor 406 and the synthetic reverberated signal provided by the processor 408.

This processing is also described in known technology reference [1]. The result of the above described approach should be perceptually as far as possible identical to the result of a convolution of the complete impulse response, the full-conversion approach described with regard to FIG. 6(*a*). However, if an audio signal or, more general, audio material is convolved with the direct sound and an early reflection part of the impulse response, the different resulting channels are added up to form an overall sound signal that is associated with the playback signal to one ear of the listener. The reverberation, however, is not calculated from this overall signal, but is in general a reverberated signal of one channel or of the downmix of the original input audio signal. It has been determined by the inventors of the present invention that therefore the late reverberation is not adequately fitting with the convolution result provided by the processor 406. It has been found out that the adequate level of reverberation depends both on the input audio signal and on the room impulse responses 300. The influence of the impulse responses is achieved by the use of reverberation characteristics as input parameter of a reverberator that may be part of the processor 408, and these input parameters are obtained from an analysis of measured impulse responses, for example the frequency-dependent reverberation time and the frequency-dependent energy measure. These measures, in general, may be determined from a single impulse response, for example by calculating the energy and the RT60 reverberation time in an octave filterbank analysis, or are mean values of the results of multiple impulse response analyses.

However, it has been found out that despite these input parameters provided to the reverberator, the influence of the input audio signal on the reverberation is not fully preserved when using a synthetic reverberation approach as is described with regard to FIG. 6(*b*). For example, due to the downmix used for generating the synthetic reverberation tail, the influence of the input audio signal is lost. The resulting level of reverberation is therefore not perceptually identical to the result of the full-convolution approach, especially in case the input signal comprises multiple channels.

So far, there are no known approaches that compare the amount of late reverberation with the results of the full-convolutional approach or match it to the convolutional result. There are some techniques that try to rate the quality of late reverberation or how natural it sounds. For example, in one method a loudness measure for natural sounding reverberation is defined, which predicts the perceived loudness of reverberation using a loudness model. This approach is described in known technology reference [2], and the level can be fitted to a target value. The disadvantage of this approach is that it relies on a model of human hearing which is complicated and not exact. It also needs a target loudness to provide a scaling factor for the late reverberation that could be found using the full-convolution result.

In another method described in known technology reference [3] a cross-correlation criterion for artificial reverberation quality testing is used. However, this is only applicable for testing different reverberation algorithms, but not for multichannel audio, not for binaural audio and not for qualifying the scaling of late reverberation.

Another possible approach is to use of the number of input channels at the considered ear as a scaling factor, however this does not give a perceptually correct scaling, because the perceived amplitude of the overall sound signal depends on the correlation of the different audio channels and not just on the number of channels.

Therefore, in accordance with the inventive approach a signal-dependent scaling method is provided which adapts the level of reverberation according to the input audio signal. As mentioned above, the perceived level of the reverberation is desired to match with the level of reverberation when using the full-convolution approach for the binaural rendering, and the determination of a measure for an adequate level of reverberation is therefore important for achieving a good sound quality. In accordance with embodiments, an audio signal is separately processed with an early part and a late reverberation of the room impulse response, wherein processing the late reverberation comprises generating a scaled reverberated signal, the scaling being dependent on the audio signal. The processed early part of the audio signal and the scaled reverberated signal are combined into the output signal. In accordance with one embodiment the scaling is dependent on the condition of the one or more input channels of the audio signal (e.g. the number of input channels, the number of active input channels and/or the activity in the input channel). In accordance another embodiment the scaling is dependent on a predefined or calculated correlation measure for the audio signal. Alternative embodiments may perform the scaling based on a combination of the condition of the one or more input channels and the predefined or calculated correlation measure.

In accordance with embodiments the scaled reverberated signal may be generated by applying a gain factor that is determined based on the condition of the one or more input channels of the audio signal, or based on the predefined or calculated correlation measure for the audio signal, or based on a combination thereof.

In accordance with embodiments, separate processing the audio signal comprises processing the audio signal with the early reflection part 301, 302 of the room impulse response 300 during a first process, and processing the audio signal with the diffuse reverberation 304 of the room impulse response 300 during a second process that is different and separate from the first process. Changing from the first process to the second process occurs at the transition time. In accordance with further embodiments, in the second process the diffuse (late) reverberation 304 may be replaced by a synthetic reverberation. In this case the room impulse response applied to the first process contains only the early reflection part 300, 302 (see FIG. 5) and the late diffuse reverberation 304 is not included.

Figure 7:
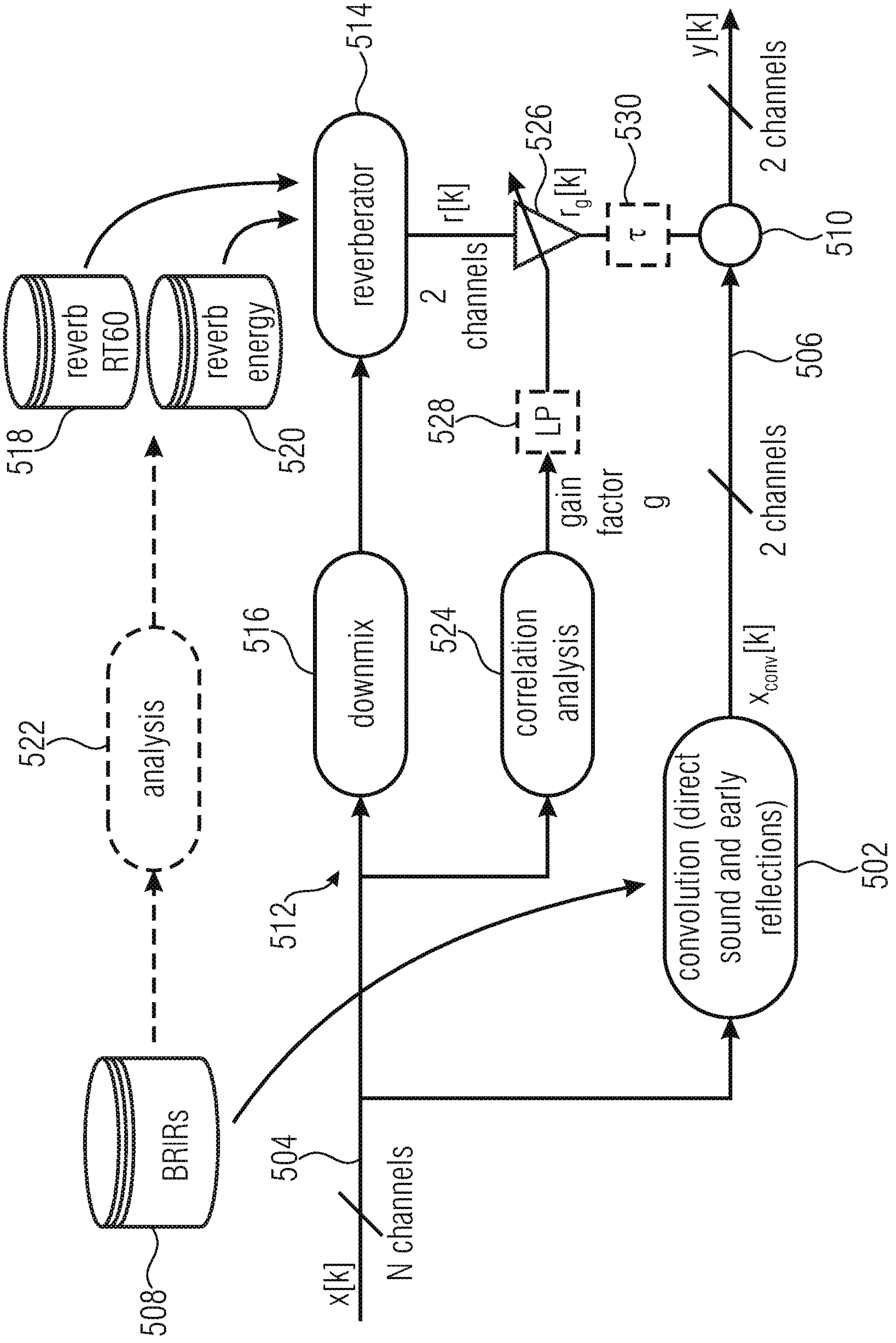
FIG. 7 illustrates a block diagram of a signal processing unit, like a binaural renderer, operating in accordance with the teachings of the present invention.

In the following an embodiment of the inventive approach will be described in further detail in accordance with which the gain factor is calculated on the basis of a correlation analysis of the input audio signal. FIG. 7 shows a block diagram of a signal processing unit, like a binaural renderer, operating in accordance with the teachings of the present invention. The binaural renderer 500 comprises a first branch including the processor 502 receiving from an input 504 the audio signal x[k] including N channels. The processor 502, when being part of a binaural renderer, processes the input signal 504 to generate the output signal 506 $x_{conv}$[k]. More specifically, the processor 502 cause a convolution of the audio input signal 504 with a direct sound and early reflections of the room impulse response that may be provided to the processor 502 from an external database 508 holding a plurality of recorded binaural room impulse responses. The processor 502, as mentioned, may operate on the basis of binaural room impulse responses provided by database 508, thereby yielding the output signal 502 having only two channels. The output signal 506 is provided from the processor 502 to an adder 510. The input signal 504 is further provided to a reverberation branch 512 including the reverberator processor 514 and a downmixer 516. The downmixed input signal is provided to the reverberator 514 that on the basis of reverberator parameters, like the reverberation RT60 and the reverberation energy held in databases 518 and 520, respectively, generates a reverberated signal r[k] at the output of the reverberator 514 which may include only two channels. The parameters stored in databases 518 and 520 may be obtained from the stored binaural room impulse responses by an appropriate analysis 522 as it is indicated in dashed lines in FIG. 7.

The reverberation branch 512 further includes a correlation analysis processor 524 that receives the input signal 504 and generates a gain factor g at its output. Further, a gain stage 526 is provided that is coupled between the reverberator 514 and the adder 510. The gain stage 526 is controlled by the gain factor g, thereby generating at the output of the gain stage 526 the scaled reverberated signal $r_g$[k] that is applied to the adder 510. The adder 510 combines the early processed part and the reverberated signal to provide the output signal y[k] which also includes two channels. Optionally, the reverberation branch 512 may comprise a low pass filter 528 coupled between the processor 524 and the gain stage for smoothing the gain factor over a number of audio frames. Optionally, a delay element 530 may also be provided between the output of the gain stage 526 and the adder 510 for delaying the scaled reverberated signal such that it matches a transition between the early reflection and the reverberation in the room impulse response.

As described above, FIG. 7 is a block diagram of a binaural renderer that processes direct sound and early reflections separately from the late reverberation. As can be seen, the input signal x[k] that is processed with the direct and early reflections of the binaural room impulse response results in a signal $x_{conv}$[k]. This signal, as is shown, is forwarded to the adder 510 for adding it to a reverberant signal component $r_g$[k]. This signal is generated by feeding a downmix, for example a stereo downmix, of the input signal x[k] to the reverberator 514 followed by the multiplier or gain stage 526 that receives a reverberated signal r[k] of the downmix and the gain factor g. The gain factor g is obtained by a correlation analysis of the input signal x[k] carried out by the processor 524, and as mentioned above may be smoothed over time by the low pass filter 528. The scaled or weighted reverberant component may optionally be delayed by the delay element 530 to match its start with the transition point from early reflections to late reverberation so that at the output of the adder 510 the output signal y[k] is obtained.

The multichannel binaural renderer depicted in FIG. 7 introduces a synthetic 2-channel late reverberation and for overcoming the above discussed drawbacks of conventional approaches and in accordance with the inventive approach the synthetic late reverberation is scaled by the gain factor g to match the perception with a result of a full-convolution approach. The superposition of multiple channels (for example up to 22.2) at the ear of a listener is correlation-dependent. That is why the late reverberation may be scaled according to the correlation of the input signal channel, and embodiments of the inventive approach provides a correlation-based time-dependent scaling method that determines an adequate amplitude of the late reverberation.

For calculating the scaling factors, a correlation measure is introduced that is based on the correlation coefficient and in accordance with embodiments, is defined in a two-dimensional time-frequency domain, for example the QMF domain. A correlation value between −1 and 1 is calculated for each multi-dimensional audio frame, each audio frame being defined by a number of frequency bands N, a number of time slots M per frame, and a number of audio channels A. One scaling factor per frame per ear is obtained.

In the following, an embodiment of the invention approach will be described in further detail.

First of all, reference is made to the correlation measure used in the correlation analysis processor 524 of FIG. 7. The correlation measure, in accordance with this embodiment, is based on the Pearson's Product Moment Coefficient (also known as correlation coefficient) that is calculated by dividing the covariance of two variables X, Y by the product of their standard deviations:

$$\rho_{\{X,Y\}} = \frac{E\{(X-\bar{X})\cdot(Y-\bar{Y})\}}{\sigma_X\cdot\sigma_Y}$$

where $E\{\cdot\}$=expected value operator $\rho_{\{X,Y\}}$=correlation coefficient, $\sigma_X$, $\sigma_Y$=standard deviations of variables X, Y This processing in accordance with the described embodiment is transferred to two dimensions in a time-frequency domain, for example the QMF-domain. The two dimensions are the time slots and the QMF bands. This approach is reasonable, because the data is often encoded and transmitted also in the time-frequency domain. The expectation operator is replaced with a mean operation over several time and/or frequency samples so that the time-frequency correlation measure between two zero-mean variables $x_m$, $x_n$ in the range of (0, 1) is defined as follows:

$$\rho[m,n] = \left| \frac{1}{(N-1)} \cdot \frac{\sum_i \sum_j x_m[i,j] \cdot x_n[i,j]^*}{\sum_j \sigma(x_m[j]) \cdot \sigma(x_n[j])} \right|$$

$\rho[m,n]$=correlation coefficient, $\sigma(x_m[j])$=standard deviation across one time slot j of channel m, $\sigma(x_n[j])$=standard deviation across one time slot j of channel n, $x_m, x_n$=zero-mean variables, $i\forall[1,N]$=frequency bands, $j\forall[1,M]$=time slots, $m,n\forall[1,K]$=channels,

*=complex conjugate.

After the calculation of this coefficient for a plurality of channel combinations (m,n) of one audio frame, the values of $\rho[m,n,t_i]$ are combined to a single correlation measure $\rho_m(t_i)$ by taking the mean of (or averaging) a plurality of correlation values $\rho[m,n,t_i]$. It is noted that the audio frame may comprise 32 QMF time slots, and $t_i$ indicates the respective audio frame. The above processing may be summarized for one audio frame as follows:

(i) First, the overall mean value $\bar{x}(k)$ for every of the k channels of the audio or data frame x having a size [N,M,K] is calculated, wherein in accordance with embodiments all k channels are downmixed to one input channel of the reverberator.

(ii) A zero-mean audio or data frame is calculated by subtracting the values (k) from the corresponding channels.

(iii) For a plurality of channel combination (m,n) the defined correlation coefficient or correlation value c is calculated.

(iv) A mean correlation value cm is calculated as the mean of a plurality of correlation values $\rho[m,n]$ (excluding erroneously calculated values by for example a division by zero).

In accordance with the above described embodiment the scaling was determined based on the calculated correlation measure for the audio signal. This is advantageous, despite the additional computational resources needed, e.g., when it is desired to obtain the correlation measure for the currently processed audio signal individually.

However, the present invention is not limited to such an approach. In accordance with other embodiments, rather that calculating the correlation measure also a predefined correlation measure may be used. Using a predefined correlation measure is advantageous as it reduces the computational complexity in the process. The predefined correlation measure may have a fixed value, e.g. 0.1 to 0.9, that may be determined empirically on the basis of an analysis of a plurality of audio signals. In such a case the correlation analysis 524 may be omitted and the gain of the gain stage may be set by an appropriate control signal.

In accordance with other embodiments the scaling may be dependent on the condition of the one or more input channels of the audio signal (e.g. the number of input channels, the number of active input channels and/or the activity in the input channel). This is advantageous because the scaling can be easily determined from the input audio signal with a reduced computational overhead. For example, the scaling can be determined by simply determining the number of channels in the original audio signal that are downmixed to a currently considered downmix channel including a reduced number of channels when compared to the original audio signal. Alternatively, the number of active channels (channels showing some activity in a current audio frame) downmixed to the currently considered downmix channel may form the basis for scaling the reverberated signal. this may be done in the block 524.

In the following, an embodiment will be described in detail determining the scaling of the reverberated signal on the basis of the condition of the one or more input channels of the audio signal and on the basis of a correlation measure (either fixed or calculated as above described). In accordance with such an embodiment, the gain factor or gain or scaling factor g is defined as follows:

$$g = c_u + \rho \cdot (c_c - c_u)$$

$$c_u = 10^{\frac{10 \cdot log_{10}(K_{in})}{20}} = \sqrt{K_{in}}$$

$$c_c = 10^{\frac{20 \cdot log_{10}(K_{in})}{20}} = K_{in}$$

where $\rho$=predefined or calculated correlation coefficient for the audio signal, $c_u$, $c_c$=factors indicative of the condition of the one or more input channels of the audio signal, with $c_u$ referring to totally uncorrelated channels, and $c_c$ relating to totally correlated channels, $K_{in}$ number of active non-zero or fixed downmix channels.

$c_u$ is the factor that is applied if the downmixed channels are totally uncorrelated (no inter-channel dependencies). In case of using only the condition of the one or more input channels $g=c_u$ and the predefined fixed correlation coefficient is set to zero. $c_c$ is the factor that is applied if the downmixed channels are totally correlated (signals are weighted versions (plus phase-shift and offset) of each other's). In case of using only the condition of the one or more input channels $g=c_c$ and the predefined fixed correlation coefficient is set to one. These factors describe the minimum and maximum scaling of the late reverberation in the audio frame (depending on the number of (active) channels).

The "channel number" $K_{in}$ is defined, in accordance with embodiments, as follows: A multichannel audio signal is downmixed to a stereo downmix using a downmix matrix Q that defines which input channels are included in which downmix channel (size M×2, with M being the number of input channels of the audio input material, e.g. 6 channels for a 5.1 setup).

An example for the downmix matrix Q may be as follows:

$$Q = \begin{bmatrix} 1 & 0 \\ 0 & 1 \\ 0.7071 & 0.7071 \\ 1 & 0 \\ 0 & 1 \\ 0 & 0 \end{bmatrix}$$

For each of the two downmix channels the scaling coefficient is calculated as follows:

$$g=f(c_c,c_u,\rho_{avg})=c_u+\rho_{avg}\cdot(c_c-c_u)$$

with $\rho_{avg}$ being the average/mean value of all correlation coefficients $\rho[m,n]$ for a number of $K_{in} \cdot K_{in}$ channel combinations [m, n] and $c_c$, $c_u$ being dependent on the channel number $K_{in}$, which may be as follows:

- $K_{in}$ may be the number of channels that are downmixed to the currently considered downmix channel $k \in [1,2]$ (the number of rows in the downmix matrix Q in the column k that contain values unequal to zero). This number is time-invariant because the downmix matrix Q is predefined for one input channel configuration and does not change over the length of one audio input signal.
- E.g. when considering a 5.1 input signal the following applies:
  - channels 1, 3, 4 are downmixed to downmix channel 1 (see matrix Q above),
  - $K_{in}=3$ in every frame (3 channels)
- $K_{in}$ may be the number of active channels that are downmixed to the currently considered downmix channel $k \in [1,2]$ (number of input channels where there is activity in the current audio frame and where the corresponding row of the downmix matrix Q in the column k contains a value unequal to zero number of channels in the intersection of active channels and non-equal elements in column k of Q). This number may be time-variant over the length of one audio input signal, because even if Q stays the same, the signal activity may vary over time.
- E.g. when considering a 5.1 input signal the following applies:
  - channels 1, 3, 4 are downmixed to downmix channel 1 (see matrix Q above),
  - In frame n:
    - the active channels are channels 1, 2, 4,
    - $K_{in}$ is the number of channels in the intersection {1, 4},
    - $K_{in}(n)=2$
  - In frame n+1:
    - the active channels are channels 1, 2, 3, 4
    - $K_{in}$ is the number of channels in the intersection {1, 3, 4},
    - $K_{in}(n+1)=3$.

An audio channel (in a predefined frame) may be considered active in case it has an amplitude or an energy within the predefined frame that exceeds a preset threshold value, e.g., in accordance with embodiments, an activity in an audio channel (in a predefined frame) may be defined as follows:

- the sum or maximum value of the absolute amplitudes of the signal (in the time domain, QMF domain, etc.) in the frame is bigger than zero, or
- the sum or maximum value of the signal energy (squared absolute value of amplitudes in time domain or QMF domain) in the frame is bigger than zero.

Instead of zero also another threshold (relative to the maximum energy or amplitude) bigger than zero may be used, e.g. a threshold of 0.01.

In accordance with embodiments, a gain factor for each ear is provided which depends on the number of active (time-varying) or the fixed number of included channels (downmix matrix unequal to zero) $K_{in}$ in the downmix channel. It is assumed that the factor linearly increases between the totally uncorrelated and the totally correlated case. Totally uncorrelated means no inter-channel dependencies (correlation value is zero) and totally correlated means the signals are weighted versions of each other's (with phase difference of offset, correlation value is one).

As mentioned above, the gain or scaling factor g may be smoothed over the audio frames by the low pass filter 528. The low pass filter 528 may have a time constant of $t_s$ which results in a smoothed gain factor of $g_s(t)$ for a frame size k as follows:

$$g_s(t_i) = c_{s,old} \cdot g_s(t_i - 1) + c_{s,new} \cdot g$$

$$c_{s,old} = e^{-\left(\frac{1}{f_s \cdot \frac{t_s}{k}}\right)}$$

$$c_{s,new} = 1 - c_{s,old}$$

where $t_s$=time constant of the low pass filter in [s]

$t_i$=audio frame at frame $t_i$ $g_s$=smoothed gain factor k=frame size, and $f_s$=sampling frequency in [Hz]

The frame size k may be the size of an audio frame in time domain samples, e.g. 2048 samples.

The left channel reverbed signal of the audio frame $x(t_i)$ is then scaled by the factor $g_{s,left}(t_i)$ and the right channel reverbed signal is scaled by the factor $g_{s,right}(t_i)$ The scaling factor is once calculated with $K_{in}$ as the number of (active non-zero or total number of) channels that are present in the left channel of the stereo downmix that is fed to the reverberator resulting in the scaling factor $g_{s,left}(t_i)$. Then the scaling factor is calculated once more with $K_{in}$ as the number of (active non-zero or total number of) channels that are present in the right channel of the stereo downmix that is fed to the reverberator resulting in the scaling factor $g_{s,right}(t_i)$ The reverberator gives back a stereo reverberated version of the audio frame. The left channel of the reverberated version (or the left channel of the input of the reverberator) is scaled with $g_{s,left}(t_i)$ and the right channel of the reverberated version (or the right channel of the input of the reverberator) is scaled with $g_{s,right}(t_i)$.

The scaled artificial (synthetic) late reverberation is applied to the adder 510 to be added to the signal 506 which has been processed with the direct sound and the early reflections.

As mentioned above, the inventive approach, in accordance with embodiments may be used in a binaural processor for binaural processing of audio signals. In the following an embodiment of binaural processing of audio signals will be described. The binaural processing may be carried out as a decoder process converting the decoded signal into a binaural downmix signal that provides a surround sound experience when listened to over headphones.

Figure 8:
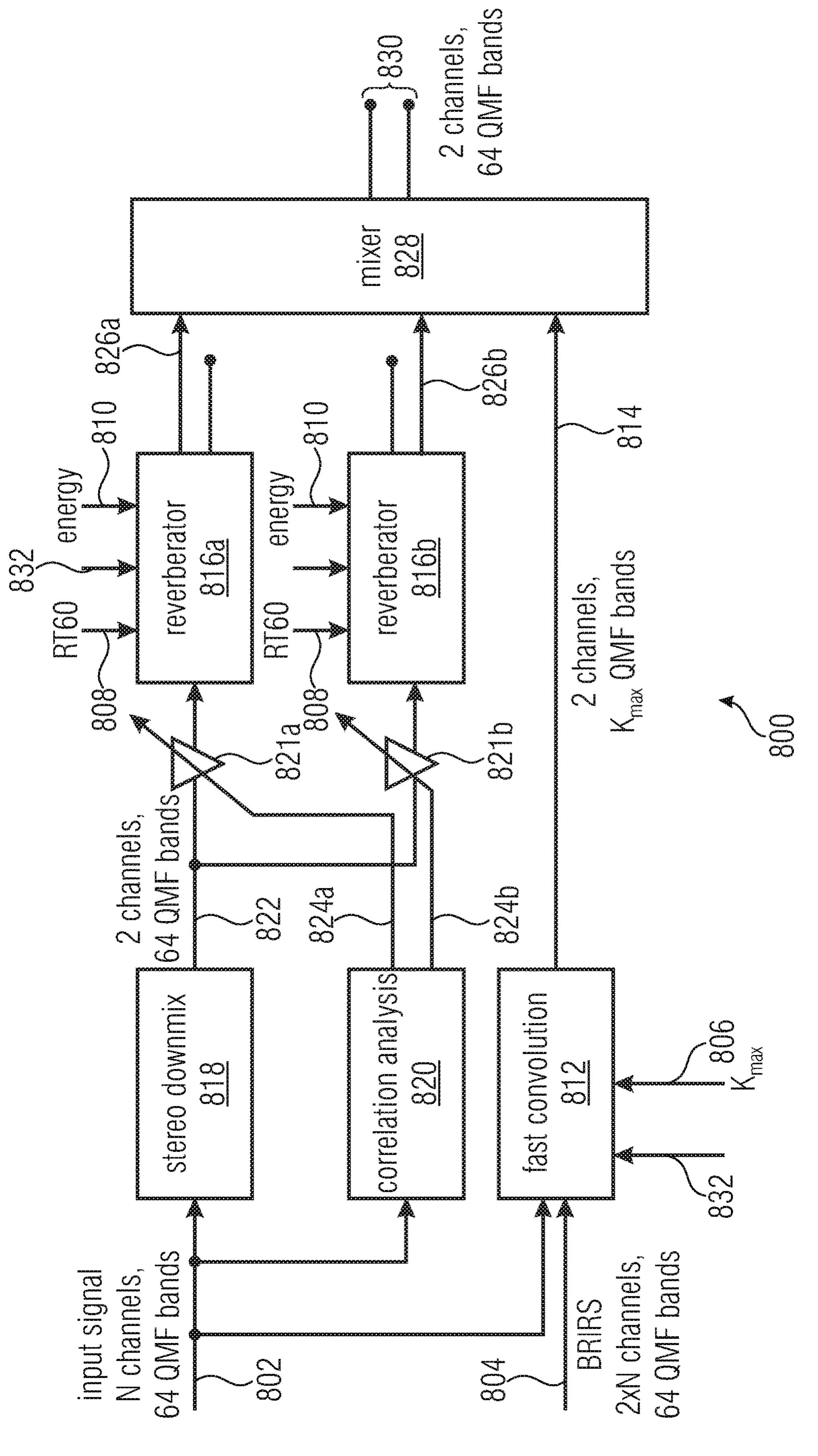
FIG. 8 schematically illustrates the binaural processing of audio signals in a binaural renderer for in accordance with an embodiment of the present invention.

FIG. 8 shows a schematic representation of a binaural renderer 800 for binaural processing of audio signals in accordance with an embodiment of the present invention. FIG. 8 also provides an overview of the QMF domain processing in the binaural renderer. At an input 802 the binaural renderer 800 receives the audio signal to be processed, e.g., an input signal including N channels and 64 QMF bands. In addition the binaural renderer 800 receives a number of input parameters for controlling the processing of the audio signal. The input parameters include the binaural room impulse response (BRIR) 804 for 2×N channels and 64 QMF bands, an indication $K_{max}$ 806 of the maximum band that is used for the convolution of the audio input signal with the early reflection part of the BRIRs 804, and the reverberator parameters 808 and 810 mentioned above (RT60 and the reverberation energy). The binaural renderer 800 comprises a fast convolution processor 812 for processing the input audio signal 802 with the early part of the received BRIRs 804. The processor 812 generates at an output the early processed signal 814 including two channels and $K_{max}$ QMF bands. The binaural renderer 800 comprises, besides the early processing branch having the fast convolution processor 812, also a reverberation branch including two reverberators 816*a* and 816*b* each receiving as input parameter the RT60 information 808 and the reverberation energy information 810. The reverberation branch further includes a stereo downmix processor 818 and a correlation analysis processor 820 both also receiving the input audio signal 802. In addition, two gain stages 821*a* and 821*b* are provided between the stereo downmix processor 818 and the respective reverberators 816*a* and 816*b* for controlling the gain of a downmixed signal 822 provided by the stereo downmix processor 818. The stereo downmix processor 818 provides on the basis of the input signal 802 the downmixed signal 822 having two bands and 64 QMF bands. The gain of the gain stages 821*a* and 821*b* is controlled by a respective control signals 824*a* and 824*b* provided by the correlation analysis processor 820. The gain controlled downmixed signal is input into the respective reverberators 816*a* and 816*b* generating respective reverberated signals 826*a*, 826*b*. The early processed signal 814 and the reverberated signals 826*a*, 826*b* are received by a mixer 828 that combines the received signals into the output audio signal 830 having two channels and 64 QMF bands. In addition, in accordance with the present invention, the fast convolution processor 812 and the reverberators 816*a* and 816*b* receive an additional input parameter 832 indicating the transition in the room impulse response 804 from the early part to the late reverberation determined as discussed above.

The binaural renderer module 800 (e.g., the binaural renderer 236 of FIG. 2 or FIG. 4) has as input 802 the decoded data stream. The signal is processed by a QMF analysis filterbank as outlined in ISO/IEC 14496-3:2009, subclause 4.6.18.2 with the modifications stated in ISO/IEC 14496-3:2009, subclause 8.6.4.2. The renderer module 800 may also process QMF domain input data; in this case the analysis filterbank may be omitted. The binaural room impulse responses (BRIRs) 804 are represented as complex QMF domain filters. The conversion from time domain binaural room impulse responses to the complex QMF filter representation is outlined in ISO/IEC FDIS 23003-1:2006, Annex B. The BRIRs 804 are limited to a certain number of time slots in the complex QMF domain, such that they contain only the early reflection part 301, 302 (see FIG. 5) and the late diffuse reverberation 304 is not included. The transition point 832 from early reflections to late reverberation is determined as described above, e.g., by an analysis of the BRIRs 804 in a preprocessing step of the binaural processing. The QMF domain audio signals 802 and the QMF domain BRIRs 804 are then processed by a bandwise fast convolution 812 to perform the binaural processing. A QMF domain reverberator 816*a*, 816*b* is used to generate a 2-channel QMF domain late reverberation 826*a*, 826*b*. The reverberation module 816*a*, 816*b* uses a set of frequency-dependent reverberation times 808 and energy values 810 to adapt the characteristics of the reverberation. The waveform of the reverberation is based on a stereo downmix 818 of the audio input signal 802 and it is adaptively scaled 821*a*, 821*b* in amplitude depending on a correlational analysis 820 of the multi-channel audio signal 802. The 2-channel QMF domain convolutional result 814 and the 2-channel QMF domain reverberation 816*a*, 816*b* are then combined 828 and finally, two QMF synthesis filter banks compute the binaural time domain output signals 830 as outlined in ISO/IEC 14496-3:2009, subclause 4.6.18.4.2. The renderer can also produce QMF domain output data; the synthesis filterbank is then omitted.

Definitions

Audio signals 802 that are fed into the binaural renderer module 800 are referred to as input signals in the following. Audio signals 830 that are the result of the binaural processing are referred to as output signals. The input signals 802 of the binaural renderer module 800 are audio output signals of the core decoder (see for example signals 228 in FIG. 2). The following variable definitions are used:

| | |
|---|---|
| $N_{in}$ | Number of input channels |
| $N_{out}$ | Number of output channels, $N_{out} = 2$ |
| $M_{DMX}$ | Downmix matrix containing real-valued non-negative downmix coefficients (downmix gains). $M_{DMX}$ is of dimension $N_{out} \times N_{in}$ |
| L | Frame length measured in time domain audio samples. |
| v | Time domain sample index |
| n | QMF time slot index (subband sample index) |
| $L_n$ | Frame length measured in QMF time slots |
| F | Frame index (frame number) |
| K | Number of QMF frequency bands, K = 64 |
| k | QMF band index (1..64) |
| A, B, ch | Channel indices (channel numbers of channel configurations) |
| $L_{trans}$ | Length of the BRIR's early reflection part in time domain samples |
| $L_{trans,n}$ | Length of the BRIR's early reflection part in QMF time slots |
| $N_{BRIR}$ | Number of BRIR pairs in a BRIR data set |
| $L_{FFT}$ | Length of FFT transform |
| $\Re(\cdot)$ | Real part of a complex-valued signal |
| $\Im(\cdot)$ | Imaginary part of a complex-valued signal |
| $m_{conv}$ | Vector that signals which input signal channel belongs to which BRIR pair in the BRIR data set |
| $f_{max}$ | Maximum frequency used for the binaural processing |
| $f_{max,decoder}$ | Maximum signal frequency that is present in the audio output signal of the decoder |
| $K_{max}$ | Maximum band that is used for the convolution of the audio input signal with the early reflection part of the BRIRs |
| a | Downmix matrix coefficient |
| $c_{eq,k}$ | Bandwise energy equalization factor |
| ε | Numerical constant, $\varepsilon = 10^{-20}$ |
| d | Delay in QMF domain time slots |

-continued

| | |
|---|---|
| $\breve{y}_{ch}{}^{n',k}$ | Pseudo-FFT domain signal representation in frequency band k |
| n' | Pseudo-FFT frequency index |
| $\breve{h}^{n',k}$ | Pseudo-FFT domain representation of BRIR in frequency band k |
| $\breve{z}_{ch,conv}{}^{n',k}$ | Pseudo-FFT domain convolution result in frequency band k |
| $\hat{z}_{ch,conv}{}^{n,k}$ | Intermediate signal: 2-channel convolutional result in QMF domain |
| $\hat{z}_{ch,rev}{}^{n,k}$ | Intermediate signal: 2-channel reverberation in QMF domain |
| $K_{ana}$ | Number of analysis frequency bands (used for the reverberator) |
| $f_{c,ana}$ | Center frequencies of analysis frequency bands |
| $N_{DMX,act}$ | Number of channels that are downmixed to one channel of the stereo downmix and are active in the actual signal frame |
| $c_{corr}$ | Overall correlation coefficient for one signal frame |
| $c_{corr}{}^{A,B}$ | Correlation coefficient for the combination of channels A, B |
| $\sigma\hat{y}_{ch,A}{}^{n}$ | Standard deviation for timeslot n of signal $\hat{y}_{ch,A}{}^{n}$ |
| $c_{scale}$ | Vector of two scaling factor |
| $\tilde{c}_{scale}$ | Vector of two scaling factor, smoothed over time |

Processing

The processing of the input signal is now described. The binaural renderer module operates on contiguous, non-overlapping frames of length L=2048 time domain samples of the input audio signals and outputs one frame of L samples per processed input frame of length L.

(1) Initialization and Preprocessing

The initialization of the binaural processing block is carried out before the processing of the audio samples delivered by the core decoder (see for example the decoder of 200 in FIG. 2) takes place. The initialization consists of several processing steps.

(a) Reading of Analysis Values

The reverberator module 816*a*, 816*b* takes a frequency-dependent set of reverberation times 808 and energy values 810 as input parameters. These values are read from an interface at the initialization of the binaural processing module 800. In addition the transition time 832 from early reflections to late reverberation in time domain samples is read. The values may be stored in a binary file written with 32 bit per sample, float values, little-endian ordering. The read values that are needed for the processing are stated in the table below:

| Value description | Number | Datatype |
|---|---|---|
| transition length $L_{trans}$ | 1 | Integer |
| Number of frequency bands $K_{ana}$ | 1 | Integer |
| Center frequencies $f_{c,ana}$ of frequency bands | $K_{ana}$ | Float |
| Reverberation times RT60 in seconds | $K_{ana}$ | Float |
| Energy values that represent the energy (amplitude to the power of two) of the late reverberation part of one BRIR | $K_{ana}$ | Float |

(b) Reading and Preprocessing of BRIRs

The binaural room impulse responses 804 are read from two dedicated files that store individually the left and right ear BRIRs. The time domain samples of the BRIRs are stored in integer wave-files with a resolution of 24 bit per sample and 32 channels. The ordering of BRIRs in the file is as stated in the following table:

| Channel number | Speaker label |
|---|---|
| 1 | CH_M_L045 |
| 2 | CH_M_R045 |
| 3 | CH_M_000 |
| 4 | CH_LFE1 |
| 5 | CH_M_L135 |
| 6 | CH_M_R135 |
| 7 | CH_M_L030 |
| 8 | CH_M_R030 |
| 9 | CH_M_180 |
| 10 | CH_LFE2 |
| 11 | CH_M_L090 |
| 12 | CH_M_R090 |
| 13 | CH_U_L045 |
| 14 | CH_U_R045 |
| 15 | CH_U_000 |
| 16 | CH_T_000 |
| 17 | CH_U_L135 |
| 18 | CH_U_R135 |
| 19 | CH_U_L090 |
| 20 | CH_U_R090 |
| 21 | CH_U_180 |
| 22 | CH_L_000 |
| 23 | CH_L_L045 |
| 24 | CH_L_R045 |
| 25 | CH_M_L060 |
| 26 | CH_M_R060 |
| 27 | CH_M_L110 |
| 28 | CH_M_R110 |
| 29 | CH_U_L030 |
| 30 | CH_U_R030 |
| 31 | CH_U_L110 |
| 32 | CH_U_R110 |

If there is no BRIR measured at one of the loudspeaker positions, the corresponding channel in the wave file contains zero-values. The LFE channels are not used for the binaural processing.

As a preprocessing step, the given set of binaural room impulse responses (BRIRs) is transformed from time domain filters to complex-valued QMF domain filters. The implementation of the given time domain filters in the complex-valued QMF domain is carried out according to ISO/IEC FDIS 23003-1:2006, Annex B. The prototype filter coefficients for the filter conversion are used according to ISO/IEC FDIS 23003-1:2006, Annex B, Table B.1. The time domain representation $\tilde{h}_{ch}{}^{v}=[\tilde{h}_1{}^{v} \ldots \tilde{h}_{N_{BRIR}}{}^{v}]$ with $1 \le v \le L_{trans}$ is processed to gain a complex valued QMF domain filter $\hat{h}_{ch}{}^{n,k}=[\hat{h}_1{}^{n,k} \ldots \hat{h}_{N_{BRIR}}{}^{n,k}]$ with $1 \le n \le L_{trans,n}$.

(2) Audio Signal Processing

The audio processing block of the binaural renderer module 800 obtains time domain audio samples 802 for $N_{in}$ input channels from the core decoder and generates a binaural output signal 830 consisting of $N_{out}=2$ channels.

The processing takes as input the decoded audio data 802 from the core decoder, the complex QMF domain representation of the early reflection part of the BRIR set 804, and the frequency-dependent parameter set 808, 810, 832 that is used by the QMF domain reverberator 816*a*, 816*b* to generate the late reverberation 826*a*, 826*b*.

(a) QMF Analysis of the Audio Signal

As the first processing step, the binaural renderer module transforms L=2048 time domain samples of the $N_{in}$-channel time domain input signal (coming from the core decoder) $[\tilde{y}_{ch,1}^{v} \ldots \tilde{y}_{ch,N_{in}}^{v}]=\tilde{y}_{ch}^{v}$ to an $N_{in}$-channel QMF domain signal representation 802 of dimension $L_n$=32 QMF time slots (slot index n) and K=64 frequency bands (band index k).

A QMF analysis as outlined in ISO/IEC 14496-3:2009, subclause 4.6.18.2 with the modifications stated in ISO/IEC 14496-3:2009, subclause 8.6.4.2. is performed on a frame of the time domain signal $\tilde{y}_{ch}^{v}$ to gain a frame of the QMF domain signal $[\hat{y}_{ch,1}^{n,k} \ldots \hat{y}_{ch,N_{in}}^{n,k}]=\hat{y}_{ch}^{n,k}$ with $1 \le v \le L$ and $1 \le n \le L_n$.

(b) Fast Convolution of the QMF Domain Audio Signal and the QMF Domain BRIRs

Next, a bandwise fast convolution 812 is carried out to process the QMF domain audio signal 802 and the QMF domain BRIRs 804. A FFT analysis may be carried out for each QMF frequency band k for each channel of the input signal 802 and each BRIR 804.

Due to the complex values in the QMF domain one FFT analysis is carried out on the real part of the QMF domain signal representation and one FFT analysis on the imaginary parts of the QMF domain signal representation. The results are then combined to form the final bandwise complex-valued pseudo-FFT domain signal $$\check{y}_{ch}^{n',k}=FFT(\hat{y}_{ch}^{n',k})=FFT(\Re(\hat{y}_{ch}^{n',k}))+j\cdot FFT(\Im(\hat{y}_{ch}^{n',k}))$$

and the bandwise complex-valued BRIRs $$\check{h}_1^{n',k}=FFT(\hat{h}_1^{n',k})=FFT(\Re(\hat{h}_1^{n',k}))+j\cdot FFT(\Im(\hat{h}_1^{n',k}))$$

for the left ear $$\check{h}_2^{n',k}=FFT(\hat{h}_2^{n',k})=FFT(\Re(\hat{h}_2^{n',k}))+j\cdot FFT(\Im(\hat{h}_2^{n',k}))$$

for the right ear

The length of the FFT transform is determined according to the length of the complex valued QMF domain BRIR filters $L_{trans,n}$ and the frame length in QMF domain time slots $L_n$ such that $$L_{FFT}=L_{trans,n}+L_n-1.$$

The complex-valued pseudo-FFT domain signals are then multiplied with the complex-valued pseudo-FFT domain BRIR filters to form the fast convolution results. A vector $m_{conv}$ is used to signal which channel of the input signal corresponds to which BRIR pair in the BRIR data set.

This multiplication is done bandwise for all QMF frequency bands k with $1 \le k \le K_{max}$. The maximum band $K_{max}$ is determined by the QMF band representing a frequency of either 18 kHz or the maximal signal frequency that is present in the audio signal from the core decoder $$f_{max}=min(f_{max,decoder},18\text{ kHz}).$$

The multiplication results from each audio input channel with each BRIR pair are summed up in each QMF frequency band k with $1 \le k \le K_{max}$ resulting in an intermediate 2-channel $K_{max}$-band pseudo-FFT domain signal.

$$\check{z}_{ch,1,conv}^{n',k} = \sum_{ch=1}^{ch=N_{in}} \check{y}_{ch,ch}^{n',k} \cdot \check{h}_{1,m_{conv}[ch]}^{n',k} \text{ and}$$

$$\check{z}_{ch,2,conv}^{n',k} = \sum_{ch=1}^{ch=N_{in}} \check{y}_{ch,ch}^{n',k} \cdot \check{h}_{2,m_{conv}[ch]}^{n',k}$$

are the pseudo-FFT convolution result $\check{z}_{ch,conv}^{n',k}=[\check{z}_{ch,1,conv}^{n',k},\check{z}_{ch,2,conv}^{n',k}]$ in the QMF domain frequency band k.

Next, a bandwise FFT synthesis is carried out to transform the convolution result back to the QMF domain resulting in an intermediate 2-channel $K_{max}$-band QMF domain signal with $L_{FFT}$ time slots $\hat{z}_{ch,conv}^{n,k}=[\hat{z}_{ch,1,conv}^{n,k},\hat{z}_{ch,2,conv}^{n,k}]$ with $1 \le n \le L_{FFT}$ and $1 \le k \le K_{max}$.

For each QMF domain input signal frame with L=32 timeslots a convolution result signal frame with L=32 timeslots is returned. The remaining $L_{FFT}$−32 timeslots are stored and an overlap-add processing is carried out in the following frame(s).

(c) Generation of Late Reverberation

As a second intermediate signal 826*a*, 826*b* a reverberation signal called $\hat{z}_{ch,rev}^{n,k}=[\hat{z}_{ch,1,rev}^{n,k},\hat{z}_{ch,2,rev}^{n,k}]$ is generated by a frequency domain reverberator module 816*a*, 816*b*. The frequency domain reverberator 816*a*, 816*b* takes as input a QMF domain stereo downmix 822 of one frame of the input signal, a parameter set that contains frequency-dependent reverberation times 808 and energy values 810.

The frequency domain reverberator 816*a*, 816*b* returns a 2-channel QMF domain late reverberation tail.

The maximum used band number of the frequency-dependent parameter set is calculated depending on the maximum frequency.

First, a QMF domain stereo downmix 818 of one frame of the input signal $\hat{y}_{ch}^{n,k}$ is carried out to form the input of the reverberator by a weighted summation of the input signal channels.

The weighting gains are contained in the downmix matrix $M_{DMX}$. They are real-valued and non-negative and the downmix matrix is of dimension $N_{out} \times N_{in}$. It contains a non-zero value where a channel of the input signal is mapped to one of the two output channels.

The channels that represent loudspeaker positions on the left hemisphere are mapped to the left output channel and the channels that represent loudspeakers located on the right hemisphere are mapped to the right output channel. The signals of these channels are weighted by a coefficient of 1. The channels that represent loudspeakers in the median plane are mapped to both output channels of the binaural signal. The input signals of these channels are weighted by a coefficient $$a = 0.7071 \approx \frac{1}{\sqrt{2}}.$$

In addition, an energy equalization step is performed in the downmix. It adapts the bandwise energy of one downmix channel to be equal to the sum of the bandwise energy of the input signal channels that are contained in this downmix channel. This energy equalization is conducted by a bandwise multiplication with a real-valued coefficient $$c_{eq,k} = \sqrt{\frac{P_{in}^{k}}{P_{out}^{k} + \varepsilon}}.$$

The factor $c_{eq,k}$ is limited to an interval of [0.5, 2].The numerical constant ε is introduced to avoid a division by zero. The downmix is also bandlimited to the frequency $f_{max}$; the values in all higher frequency bands are set to zero.

Figure 9:
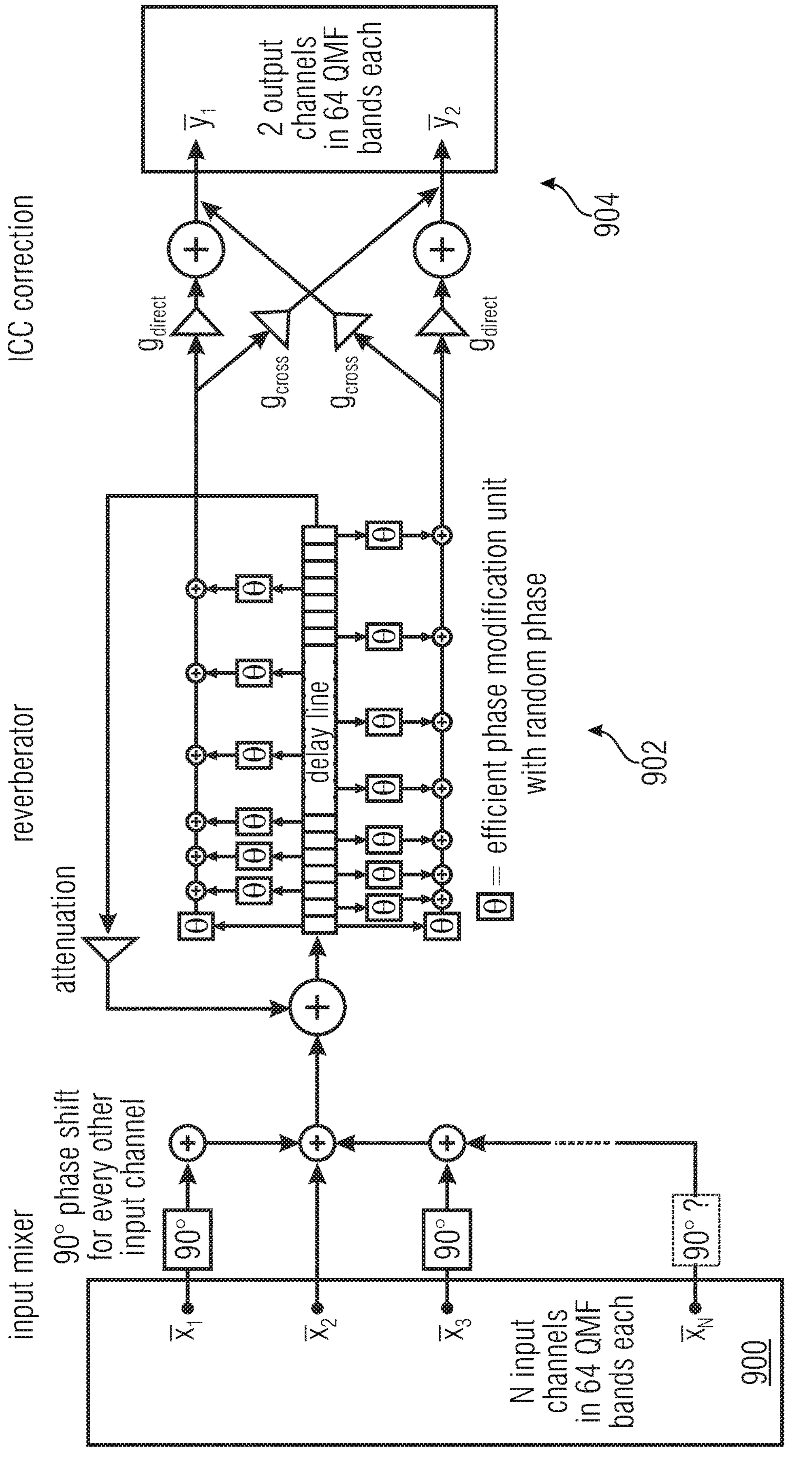
FIG. 9 schematically illustrates the processing in the frequency domain reverberator of the binaural renderer of FIG. 8 in accordance with an embodiment of the present invention.

FIG. 9 schematically represents the processing in the frequency domain reverberator 816$a$, 816$b$ of the binaural renderer 800 in accordance with an embodiment of the present invention.

In the frequency domain reverberator a mono downmix of the stereo input is calculated using an input mixer 900. This is done incoherently applying a 90° phase shift on the second input channel.

This mono signal is then fed to a feedback delay loop 902 in each frequency band k, which creates a decaying sequence of impulses. It is followed by parallel FIR decorrelators that distribute the signal energy in a decaying manner into the intervals between the impulses and create incoherence between the output channels. A decaying filter tap density is applied to create the energy decay. The filter tap phase operations are restricted to four options to implement a sparse and multiplier-free decorrelator.

After the calculation of the reverberation an inter-channel coherence (ICC) correction 904 is included in the reverberator module for every QMF frequency band. In the ICC correction step frequency-dependent direct gains $g_{direct}$ and crossmix gains $g_{cross}$ are used to adapt the ICC.

The amount of energy and the reverberation times for the different frequency bands are contained in the input parameter set. The values are given at a number of frequency points which are internally mapped to the K=64 QMF frequency bands.

Two instances of the frequency domain reverberator are used to calculate the final intermediate signal $\hat{z}_{ch,rev}^{n,k}=[\hat{z}_{ch,1,rev}^{n,k},\hat{z}_{ch,2,rev}^{n,k}]$. The signal $\hat{z}_{ch,1,rev}^{n,k}$ is the first output channel of the first instance of the reverberator, and $\hat{z}_{ch,2,rev}^{n,k}$ is the second output channel of the second instance of the reverberator. They are combined to the final reverberation signal frame that has the dimension of 2 channels, 64 bands and 32 time slots.

The stereo downmix 822 is both times scaled 821$a,b$ according to a correlation measure 820 of the input signal frame to ensure the right scaling of the reverberator output. The scaling factor is defined as a value in the interval of $[\sqrt{N_{DMX,act}}, N_{DMX,act}]$ linearly depending on a correlation coefficient $c_{corr}$ between 0 and 1 with $$c_{corr} = \frac{1}{N_{in}^{2}} \cdot \sum_{A=1}^{A=N_{DMX,act}} \sum_{B=1}^{B=N_{DMX,act}} c_{corr}^{A,B} \text{ and}$$

$$c_{corr}^{A,B} = \left| \frac{1}{K-1} \frac{\sum_{k}\sum_{n} \hat{\hat{y}}_{ch,A}^{n,k} \cdot \hat{\hat{y}}_{ch,B}^{n,k\,*}}{\sum_{n} \sigma_{\hat{y}_{ch,A}^{n}} \cdot \sigma_{\hat{y}_{ch,B}^{n}}} \right|$$

where $\sigma_{\hat{y}_{ch,A}^{n}}$ means the standard deviation across one time slot n of channel A, the operator {*} denotes the complex conjugate and $\hat{\hat{y}}$ is the zero-mean version of the QMF domain signal $\hat{y}$ in the actual signal frame.

$c_{corr}$ is calculated twice: once for the plurality of channels A, B that are active at the actual signal frame F and are included in the left channel of the stereo downmix and once for the plurality of channels A, B that are active at the actual signal frame F and that are included in the right channel of the stereo downmix. $N_{DMX,act}$ is the number of input channels that are downmixed to one downmix channel A (number of matrix element in the Ath row of the downmix matrix $M_{DMX}$ that are unequal to zero) and that are active in the current frame.

The scaling factors then are $$c_{scale} = [c_{scale,1}, c_{scale,2}] = \left[\sqrt{N_{DMX,act,1}} + c_{corr} \cdot \left(N_{DMX,act,1} - \sqrt{N_{DMX,act,1}}\right), \sqrt{N_{DMX,act,2}} + c_{corr} \cdot \left(N_{DMX,act,2} - \sqrt{N_{DMX,act,2}}\right)\right].$$

The scaling factors are smoothed over audio signal frames by a $1^{st}$ order low pass filter resulting in smoothed scaling factors $\tilde{c}_{scale}=[\tilde{c}_{scale,1},\tilde{c}_{scale,2}]$.

The scaling factors are initialized in the first audio input data frame by a time-domain correlation analysis with the same means.

The input of the first reverberator instance is scaled with the scaling factor $\tilde{c}_{scale,1}$ and the input of the second reverberator instance is scaled with the scaling factor $\tilde{c}_{scale,2}$ (d) Combination of Convolutional Results and Late Reverberation Next, the convolutional result 814, in $\hat{z}_{ch,conv}^{n,k}=[\hat{z}_{ch,1,conv}^{n,k},\hat{z}_{ch,2,conv}^{n,k}]$, and the reverberator output 826$a$, 826$b$, $\hat{z}_{ch,rev}^{n,k}=[\hat{z}_{ch,1,rev}^{n,k},\hat{z}_{ch,2,rev}^{n,k}]$, for one QMF domain audio input frame are combined by a mixing process 828 that bandwise adds up the two signals. Note that the upper bands higher than $K_{max}$ are zero in $\hat{z}_{ch,conv}^{n,k}$ because the convolution is only conducted in the bands up to $K_{max}$.

The late reverberation output is delayed by an amount of $d=((L_{trans}-20\cdot 64+1)/64+0.5)+1$ time slots in the mixing process.

The delay d takes into account the transition time from early reflections to late reflections in the BRIRs and an initial delay of the reverberator of 20 QMF time slots, as well as an analysis delay of 0.5 QMF time slots for the QMF analysis of the BRIRs to ensure the insertion of the late reverberation at a reasonable time slot. The combined signal $\hat{z}_{ch}^{n,k}$ at one time slot n calculated by $\hat{z}_{ch,conv}^{n,k}+\hat{z}_{ch,rev}^{n-d,k}$.

(e) QMF Synthesis of Binaural QMF Domain Signal

One 2-channel frame of 32 time slots of the QMF domain output signal $\hat{z}_{ch}^{n,k}$ is transformed to a 2-channel time domain signal frame with length L by the QMF synthesis according to ISO/IEC 14496-3:2009, subclause 4.6.18.4.2. yielding the final time domain output signal 830, $\tilde{z}_{ch}^{v}=[\tilde{z}_{ch,1}^{v} \ldots \tilde{z}_{ch,2}^{v}]$.

In accordance with the inventive approach the synthetic or artificial late reverberation is scaled taking into consideration the characteristics of the input signal, thereby improving the quality of the output signal while taking advantage of the reduced computational complexity obtained by the separate processing. Also, as can be seen from the above description, no additional hearing models or target reverberation loudness are necessitated.

It is noted that the invention is not limited to the above described embodiment. For example, while the above embodiment has been described in combination with the QMF domain, it is noted that also other time-frequency domains may be used, for example the STFT domain. Also, the scaling factor may be calculated in a frequency-dependent manner so that the correlation is not calculated over the entire number of frequency bands, namely i∀[1,N], but is calculated in a number of S subsets defined as follows:

$$i_1\forall[1,N_1], i_2\forall[N_1+1,N_2], \ldots, i_S\forall[N_{S-1}+N]$$

Also, smoothing may be applied across the frequency bands or bands may be combined according to a specific rule, for example according to the frequency resolution of the hearing. Smoothing may be adapted to different time constants, for example dependent on the frame size or the preference of the listener.

The inventive approach may also be applied for different frame sizes, even a frame size of just one time slot in the time-frequency domain is possible.

In accordance with embodiments, different downmix matrices may be used for the downmix, for example symmetric downmix matrices or asymmetric matrices.

The correlation measure may be derived from parameters that are transmitted in the audio bitstream, for example from the inter-channel coherence in the MPEG surround or SAOC. Also, in accordance with embodiments it is possible to exclude some values of the matrix from the mean-value calculation, for example erroneously calculated values or values on the main diagonal, the autocorrelation values, if necessitated.

The process may be carried out at the encoder instead of using it in the binaural renderer at the decoder side, for example when applying a low complexity binaural profile. This results in that some representation of the scaling factors, for example the scaling factors themselves, the correlation measure between 0 and 1 and the like, and these parameters are transmitted in the bitstream from the encoder to the decoder for a fixed downstream matrix.

Also, while the above described embodiment is described applying the gain following the reverberator 514, it is noted that in accordance with other embodiments the gain can also be applied before the reverberator 514 or inside the reverberator, for example by modifying the gains inside the reverberator 514. This is advantageous as fewer computations may be necessitated.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a non-transitory storage medium such as a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or programmed to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

[1] M. R. Schroeder, "Digital Simulation of Sound Transmission in Reverberant Spaces", The Journal of the Acoustical Society of America, VoS. 47, pp. 424-431

(1970) and enhanced in JA. Moorer, "About This Reverberation Business", Computer Music Journal, Vol. 3, no. 2, pp. 13-28, MIT Press (1979).

[2] Uhle, Christian; Paulus, Jouni; Herre, Jürgen: "Predicting the Perceived Level of Late Reverberation Using Computational Models of Loudness" Proceedings, 17th International Conference on Digital Signal Processing (DSP), Jul. 6-8, 2011, Corfu, Greece.

[3] Czyzewski, Andrzej: "A Method of Artificial Reverberation Quality Testing" J. Audio Eng. Soc., Vol. 38, No 3, 1990.

The invention claimed is:

1. A method for processing an audio signal in accordance with a room impulse response, the method comprising:

separately processing the audio signal with an early part of the room impulse response to obtain an audio signal processed with the early part of the room impulse response, and with a late reverberation of the room impulse response to obtain a reverberated signal, scaling the reverberated signal to generate a scaled reverberated signal, the scaling being dependent on the audio signal; and combining the audio signal processed with the early part of the room impulse response and the scaled reverberated signal, wherein scaling the reverberated signal comprises applying a gain factor, wherein the gain factor is determined based on a condition of one or more input channels of the audio signal and/or based on a predefined or calculated correlation measure for the audio signal, and wherein the gain factor is determined as follows:

$$g=c_u+\rho\cdot(c_c-c_u)$$

where

ρ=predefined or calculated correlation measure for the audio signal, $c_u$, $c_c$=factors indicative of the condition of the one or more input channels of the audio signal, with $c_u$ referring to totally uncorrelated channels, and $c_c$ relating to totally correlated channels.

2. The method of claim 1, wherein the condition of the one or more input channels of the audio signal comprises one or more of a number of input channels, a number of active input channels and an activity in the input channel.

3. The method of claim 1, wherein scaling the reverberated signal comprises applying the gain factor before, during or after processing the audio signal with the late reverberation of the room impulse response.

4. The method of claim 1, wherein $c_u$ and $c_c$ are determined as follows:

$$c_u = 10^{\frac{10\cdot log_{10}(K_{in})}{20}} = \sqrt{K_{in}}$$

$$c_c = 10^{\frac{20\cdot log_{10}(K_{in})}{20}} = K_{in}$$

where $K_{in}$=number of active or fixed downmix channels.

5. The method of claim 1, wherein scaling the reverberated signal comprises a correlation analysis of the audio signal.

6. The method of claim 5, wherein the correlation analysis of the audio signal comprises determining for an audio frame of the audio signal the correlation measure, and wherein the correlation measure is calculated by combining correlation coefficients for a plurality of channel combinations of one audio frame, each audio frame comprising one or more time slots.

7. The method of claim 6, wherein combining the correlation coefficients comprises averaging a plurality of the correlation coefficients of the audio frame.

8. The method of claim 5, wherein determining the correlation measure comprises:

(i) calculating an overall mean value for every channel of the audio frame, (ii) calculating a zero-mean audio frame by subtracting the mean values from every channel, (iii) calculating for a plurality of channel combinations the correlation coefficient, and (iv) calculating the correlation measure as a mean of the plurality of correlation coefficients.

9. The method of claim 5, wherein the correlation coefficient for a channel combination is calculated as follows:

$$\rho[m,n] = \left| \frac{1}{(N-1)} \cdot \frac{\sum_i \sum_j x_m[i,j] \cdot x_n[i,j]^*}{\sum_j \sigma(x_m[j]) \cdot \sigma(x_n[j])} \right|$$

where

ρ[m,n]=correlation coefficient, $\sigma(x_m[j])$=standard deviation across one time slot j of channel m, $\sigma(x_n[j])$=standard deviation across one time slot j of channel n, $x_m$,$x_n$=zero-mean variables, i∀[1,N]=frequency bands, j∀[1,M]=time slots, m,n∀[1,K]=channels,

*=complex conjugate.

10. The method of claim 1, comprising delaying the scaled reverberated signal to match a start of the scaled reverberated signal to the transition point from early reflections to the late reverberation in the room impulse response.

11. The method of claim 1, wherein processing the audio signal with the late reverberation of the room impulse response comprises downmixing the audio signal and applying the downmixed audio signal to a reverberator.

12. A non-transitory digital storage medium having a computer program stored thereon to perform, when said computer program is run by a computer, a method for processing an audio signal in accordance with a room impulse response, the method comprising:

separately processing the audio signal with an early part of the room impulse response to obtain an audio signal processed with the early part of the room impulse response, and with a late reverberation of the room impulse response to obtain a reverberated signal, scaling the reverberated signal to generate a scaled reverberated signal, the scaling being dependent on the audio signal; and combining the audio signal processed with the early part of the room impulse response and the scaled reverberated signal, wherein scaling the reverberated signal comprises applying a gain factor, wherein the gain factor is determined based on a condition of one or more input channels of the audio signal and/or based on a predefined or calculated correlation measure for the audio signal, and wherein the gain factor is determined as follows:

$$g=c_u+\rho\cdot(c_c-c_u)$$

where

ρ=predefined or calculated correlation measure for the audio signal, $c_u$, $c_c$=factors indicative of the condition of the one or more input channels of the audio signal, with $c_u$ referring to totally uncorrelated channels, and $c_c$ relating to totally correlated channels.

13. A signal processing unit, comprising:

an input for receiving an audio signal, an early part processor for processing the audio signal in accordance with an early part of a room impulse response to obtain an audio signal processed with the early part of the room impulse response, a late reverberation processor for processing the audio signal in accordance with a late reverberation of the room impulse response to obtain a reverberated signal, the late reverberation processor configured to scaling the reverberated signal to generate a scaled reverberated signal, the scaling being dependent on the audio signal; and an output for combining the audio signal processed with the early part of the room impulse response and the scaled reverberated signal into an output audio signal, wherein scaling the reverberated signal comprises applying a gain factor, wherein the gain factor is determined based on a condition of one or more input channels of the audio signal and/or based on a predefined or calculated correlation measure for the audio signal, and wherein the gain factor is determined as follows:

$$g=c_u+\rho\cdot(c_c-c_u)$$

where

ρ=predefined or calculated correlation measure for the audio signal, $c_u$, $c_c$=factors indicative of the condition of the one or more input channels of the audio signal, with $c_u$ referring to totally uncorrelated channels, and $c_c$ relating to totally correlated channels.

14. The signal processing unit of claim 13, wherein the late reverberation processor comprises:

a reverberator receiving the audio signal and generating the reverberated signal; and a gain stage coupled to an input or to an output of the reverberator and controlled by the gain factor.

15. The signal processing unit of claim 14, comprising a correlation analyzer generating the gain factor dependent on the audio signal.

16. The signal processing unit of claim 14, further comprising at least one of:

a low pass filter coupled to the gain stage, and a delay element coupled between the gain stage and an adder, the adder further coupled to the early part processor and the output.

17. A binaural renderer, comprising the signal processing unit of claim 13.

18. An audio encoder for coding audio signals, comprising:

the signal processing unit of claim 13 or a binaural renderer of claim 17.

19. An audio decoder for decoding encoded audio signals, comprising:

the signal processing unit of claim 13 or the binaural renderer of claim 17.

* * * * *